United States Patent

Kikkawa et al.

Patent Number: 6,025,113
Date of Patent: Feb. 15, 2000

[54] PHOTOSENSITVE POLYMIDE PRECURSOR AND ITS USE FOR PATTERN FORMATION

[75] Inventors: Haruhiko Kikkawa; Fumio Kataoka, both of Yokohama; Issei Takemoto, Hiratsuka; Jun Tanaka, Chigasaki; Keiko Isoda, Tokyo; Shunichiro Uchimura, Hitachi; Makoto Kaji, Hitachi; Minoru Sugiura, Hitachi, all of Japan

[73] Assignee: Hitachi Chemical Company, Ltd., Japan

[21] Appl. No.: 08/876,240

[22] Filed: Jun. 16, 1997

[30] Foreign Application Priority Data

Jun. 17, 1996 [JP] Japan .................................... 8-155324
May 22, 1997 [JP] Japan .................................... 9-132353

[51] Int. Cl.$^7$ .................................................... G03F 7/038
[52] U.S. Cl. ........................... 430/283.1; 528/33; 528/229; 528/321; 528/331
[58] Field of Search ........................... 430/283.1; 528/33, 528/229, 321, 331

[56] References Cited

U.S. PATENT DOCUMENTS

| | | | |
|---|---|---|---|
| 3,692,740 | 9/1972 | Suzuki et al. | 260/47 CP |
| 5,281,690 | 1/1994 | Flaim | 528/353 |
| 5,310,862 | 5/1994 | Nomura et al. | 528/353 |
| 5,516,875 | 5/1996 | Simmons, III | 528/128 |
| 5,591,250 | 1/1997 | Stern et al. | 95/51 |
| 5,741,599 | 4/1998 | Oie et al. | 428/458 |

FOREIGN PATENT DOCUMENTS

| | | |
|---|---|---|
| 0300326 | 1/1989 | European Pat. Off. |
| 0355927 | 2/1990 | European Pat. Off. |
| 0 547 555 A2 | 6/1993 | European Pat. Off. |
| 0 424 940 B1 | 1/1998 | European Pat. Off. |
| B 63-31939 | 6/1988 | Japan |
| B63-31939 | 6/1988 | Japan |
| B 5 67026 | 9/1993 | Japan |
| B 5-67026 | 9/1993 | Japan |
| 5-339373 | 12/1993 | Japan |
| 6-258835 | 9/1994 | Japan |

OTHER PUBLICATIONS

Database WPIL in Questel, London: Derwent Publications Ltd., AN7–179604, JP 7–179604 (Nitto Denko Corp.), abstract.

Primary Examiner—Cynthia Hamilton
Attorney, Agent, or Firm—Griffen, Butler, Whisenhunt & Szipl, LLP

[57] ABSTRACT

A polyimide precursor having repeating units of the formula:

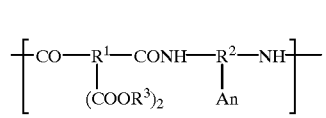

(1)

wherein $R^1$ is a tetravalent organic group having 4 or more carbon atoms; $R^2$ is a trivalent or tetravalent organic group having one or more aromatic rings; $R^3$ is a monovalent organic group; A is a monovalent group showing acidity; and n is an integer of 1 or 2, is effective for preparing a highly sensitive negative-working photosensitive material developable with an alkaline aqueous solution in a short time with high resolution.

39 Claims, 2 Drawing Sheets

SOLVENT : DMSO-d6
STANDARD : RESIDUAL PROTONS IN DMSO-d6 (2.49 ppm)

SOLVENT : DMSO-d6
STANDARD : RESIDUAL PROTONS IN DMSO-d6 (2.49 ppm)

PHOTOSENSITVE POLYMIDE PRECURSOR AND ITS USE FOR PATTERN FORMATION

BACKGROUND OF THE INVENTION

The present invention relates to a photosensitive material suitable for protective films (e.g. the surface coating films of semiconductor devices), the interlaminar insulating films of thin-film multilayer circuit boards, etc. It relates to, in particular, heat-resistant polyimides, precursors thereof, photosensitive polyimide precursor compositions containing the precursors, and negative-working photosensitive materials developable with an alkaline aqueous solution which contain the precursors, and a process for forming a resin pattern.

As photosensitive heat-resistant materials for obtaining heat-resistant polymers, there have been known the materials disclosed in JP-B 5-67026, i.e., the materials obtained by reacting an aromatic tetracarboxylic acid dianhydride with an olefin unsaturated alcohol to synthesize an olefin aromatic tetracarboxylic acid diester, and polymerizing this compound and a diamine by dehydrating condensation using a carbodiimide, to introduce thereinto a photosensitive group through a covalent bond; and the materials disclosed in JP-B 63-31939, i.e., the materials obtained by reacting an aromatic tetracarboxylic acid dianhydride with an aromatic diamine to obtain a poly(amic acid), and reacting this compound with an amine compound having a photosensitive group, to introduce the photosensitive group thereinto through an ionic bond.

In both of these prior art references, a negative relief pattern is obtained by applying a varnish prepared by dissolving the photosensitive heat-resistant material in a suitable organic solvent on a substrate, drying the varnish to form a coating film, irradiating the film with ultraviolet light through a suitable photomask to light-cure the exposed portion, and developing and rinsing the film with organic solvents, respectively.

However, when an organic solvent is used as a developer in pattern formation, exposed portion tends to be swollen during development, so that a pattern is difficult to obtain with high resolution. Moreover, the employment of an organic solvent involves problems such as undesirable influences on the health of workers, much labor required for treating a waste fluid, etc.

For solving such problems, for example, positive-working polymers obtained by introducing naphthoquinonediazidosulfonylamide groups into the carboxyl groups of a poly(amic acid) have been proposed as materials developable with an aqueous liquid (JP-A 6-258835). Since the naphthoquinonediazidosulfonylamide groups are converted to carboxyl groups by light irradiation, these polymers are characterized in that the exposed portion becomes soluble in an alkaline aqueous solution. Therefore, they are used as positive-working photosensitive materials.

The above-mentioned positive-working photosensitive materials, however, are disadvantageous in that a long time is required for development and that the sensitivity is not sufficient at a large film thickness (10 μm or more).

SUMMARY OF THE INVENTION

Accordingly, the present invention is intended to remove the above-mentioned problems and provide a photosensitive material having high resolution and sensitivity which can be rapidly developed with an aqueous solution and is hardly swollen in exposed portion during development; a polyimide precursor used in said photosensitive material; and a process for forming a resin pattern using said photosensitive material.

The present invention provides a polyimide precursor comprising repeating units represented by the following formula (1) and having a weight-average molecular weight of 10,000 to 200,000:

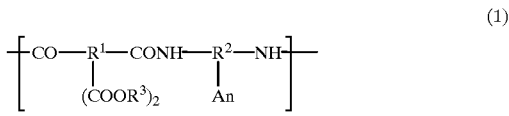

wherein $R^1$ is a tetravalent organic group containing 4 or more carbon atoms; $R^2$ is a trivalent or tetravalent organic group containing at least one aromatic ring; $R^3$ is a monovalent organic group; A is an acidic monovalent group; and n is 1 or 2.

The present invention also provides the above-mentioned polyimide precursor which further comprises repeating units represented by the formula:

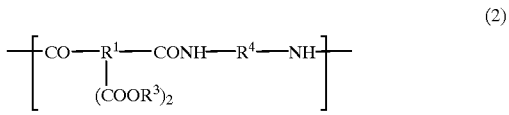

wherein $R^1$ is a tetravalent organic group containing 4 or more carbon atoms; $R^3$ is a monovalent organic group; $R^4$ is a divalent organic group containing at least one aromatic ring or silicon atom; the number of repeating units of the above formula (1) being 10 or more, and the number of repeating units of the above formula (2) being 90 or less, when the total number of the repeating units of the formulas (1) and (2) is taken as 100.

The present invention further provides a polyimide obtained from the polyimide precursor, a polyimide precursor composition and a process for forming a pattern using the polyimide.

DESCRIPTION OF THE PREFERRED EMBODIMENTS

Figure 1:
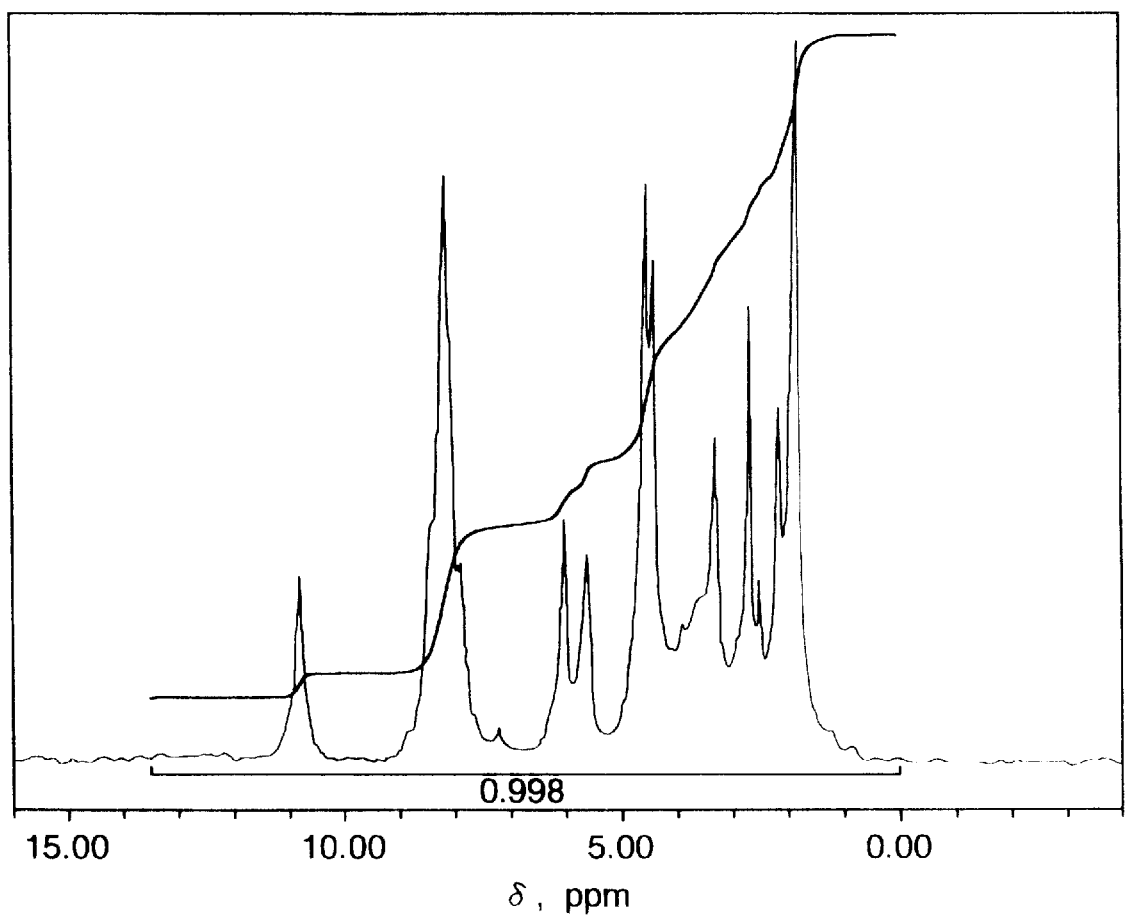
FIG. 1 is a $^1$H NMR chart of the polyimide precursor obtained in Example 1.

The present invention provides a polyimide precursor soluble in an alkaline aqueous solution. The polyimide precursor of the present invention comprises repeating units of the following formula (1) and has a weight-average molecular weight of 10,000 to 200,000, preferably 20,000 to 60,000:

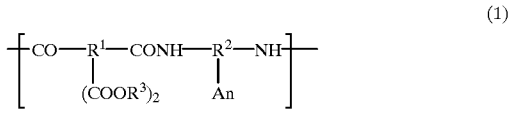

wherein $R^1$ is a tetravalent organic group containing 4 or more carbon atoms; $R^2$ is a trivalent or tetravalent organic group containing at least one aromatic ring; $R^3$ is a monovalent organic group; A is an acidic monovalent group; and n is 1 or 2.

Since this polyimide precursor has one or two acidic groups A in the structural unit of polymer, the polyimide precursor before curing is highly soluble in an alkaline aqueous solution. Therefore, such a polyimide precursor can easily be developed with an alkaline aqueous solution and hence can remove the above-mentioned various disadvantages of the employment of an organic solvent as a developer.

When a photosensitive group is used as $R^3$, the polyimide precursor can be obtained as a negative-working photosensitive polyimide precursor which is cured by exposure to light. When $R^3$ is a photosensitive group, the photosensitive group is introduced through an ester linkage, so that the curing property of exposed portion and the sensitivity are excellent even in the case of a thick film (10 μm or more). Therefore, of polyimide precursors of the above formula (1), those in which $R^3$ is a photosensitive group are characterized in that they are soluble in an alkaline aqueous solution but are cured by exposure to light to become insoluble in the alkaline aqueous solution. Accordingly, they are especially suitable for the photosensitive material of the present invention. When such a polyimide precursor is used, a negative pattern can be formed in a short development time. Thus, the present invention provides a negative-working photosensitive material characterized by containing a photosensitive polyimide precursor which is soluble in an alkaline aqueous solution but is cured by exposure to light to become insoluble in the alkaline aqueous solution.

Said polyimide precursor need not have acidic groups A in all the repeating units and it is sufficient that 10 mol % or more of the repeating units contain acidic groups A. That is, as the polyimide precursor of the present invention, there can also be used polyimide precursors which further comprise repeating units of the following formula (2) in addition to the repeating units of the above formula (1), and in which the number of repeating units of the above formula (1) is not more than 100 and not less than 10 and the number of repeating units of the formula (2) is not more than 90 and not less than 0, when the total number of the repeating units of the formulas (1) and (2) is taken as 100:

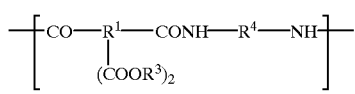
(2)

wherein $R^1$ is a tetravalent organic group containing 4 or more carbon atoms; $R^3$ is a monovalent organic group; $R^4$ is a divalent organic group containing at least one aromatic ring or silicon atom.

The polyimide precursor of the present invention can be obtained, for example, by reacting a carboxylic acid halide such as an acid chloride of the following formula (12) with a diamine of the following formula (13) in a solvent:

$(R^3OCO)_2R^1(COCl)_2$ (12)

$AnR^2(NH_2)_2$ (13)

The proportion of the diamine of the above formula (13) may be 10 mol % or more based on the total number of mols of diamine components used. That is, the polyimide precursor of the present invention can be obtained also by copolymerizing an acid chloride of the above formula (12) with a mixture of 90 mol % or less of a diamine of the following formula (14) and 10 mol % or more of a diamine of the above formula (13):

$R^4(NH_2)_2$ (14)

The present invention also provides a photosensitive material and a polyimide precursor composition which contain the polyimide precursor of the present invention. The polyimide precursor composition of the present invention preferably contains a siloxane-containing poly(amic acid) comprising repeating units of any of the following formulas (24) in addition to the above-mentioned polyimide precursor of the formula (1), for the improvement of the adhesive properties to a substrate, in particular, a silicon wafer during development and after curing:

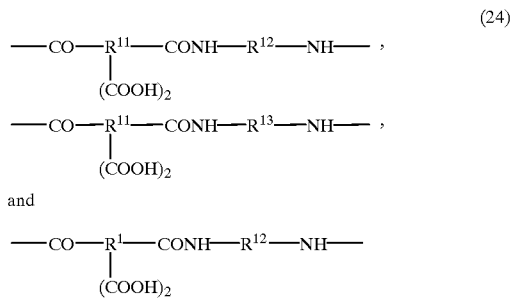
(24)

wherein $R^1$ is a tetravalent organic group containing 4 or more carbon atoms; $R^{13}$ is a divalent organic group containing at least one aromatic ring; $R^{11}$ is a tetravalent organic group having at least one siloxane skeleton; and $R^{12}$ is a divalent organic group having at least one siloxane skeleton.

The siloxane-containing poly(amic acid) need not contain siloxane skeletons in all the repeating units and it is sufficient that 1 mol % or more of the repeating units contain siloxane skeletons. That is, the following poly(amic acid)s are also effective in improving the adhesive properties of the polyimide precursor composition: poly(amic acid)s which further comprise repeating units of the following formula (25) in addition to repeating unit of any of the above formulas (24):

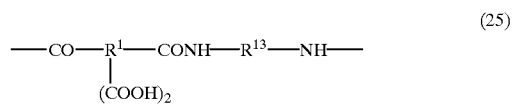
(25)

wherein $R^1$ is a tetravalent organic group containing 4 or more carbon atoms; and $R^{13}$ is a divalent organic group containing at least one aromatic ring, the number of repeating units of any of the above formulas (24) being 1 or more, and the number of repeating units of the above formula (25) being 99 or less, when the total number of the repeating units of any of the formulas (24) and the repeating units of the formula (25) is taken as 100.

As a process for forming a resin pattern using the photosensitive polyimide precursor of the present invention, the present invention further provides a process for forming a resin pattern which comprises a step of irradiating a coating film made of a photosensitive polyimide precursor composition containing the photosensitive polyimide precursor of the present invention, with light through a mask having a predetermined pattern, and a step of developing the coating film with an alkaline aqueous solution.

The present invention still further provides a polyimide comprising in the molecule 10 mol % or more of repeating units of the formula (10) shown below, as a polyimide obtained by heating and curing a polyimide precursor composition containing the polyimide precursor of the present invention. The weight-average molecular weight of the polyimide of the present invention is 10,000 to 200,000, preferably 20,000 to 60,000. The polyimide of the present invention can easily be obtained in the form of a film of a complicated shape by use of the polyimide precursor of the present invention and hence is suitable for the protective film of a semiconductor device, etc.

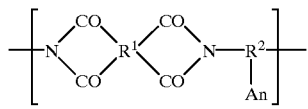

(10)

wherein $R^1$ is a tetravalent organic group containing 4 or more carbon atoms; $R^2$ is a trivalent or tetravalent organic group containing at least one aromatic ring; $R^3$ is a monovalent organic group; A is an acidic monovalent group; and n is 1 or 2.

The polyimide of the present invention may further comprise in the molecule 90 mol % or less of repeating units of the formula (11) shown below. That is, in the polyimide of the present invention, the number of repeating units of the above formula (10) is not more than 100 and not less than 10 and the number of repeating units of the above formula (11) is not more than 90 and not less than 0, when the total number of the repeating units of the formulas (10) and (11) in the molecule is taken as 100:

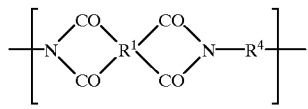

(11)

wherein $R^1$ is a tetravalent organic group containing 4 or more carbon atoms; and $R^4$ is a divalent organic group containing at least one aromatic ring or silicon atom.

Polyimides in which 1 to 30 mol % of the groups $R^1$ and/or groups $R^4$ in the molecule contain at least one siloxane skeleton are especially preferable because of their excellent adhesive properties to a substrate. For example, polyimides in which 1 to 30 mol % of the groups $R^4$ are groups represented by the following formula (35) are suitable for the surface protective film of a semiconductor device, the interlaminar insulating film of a thin-film multilayer circuit board, etc.:

(35)

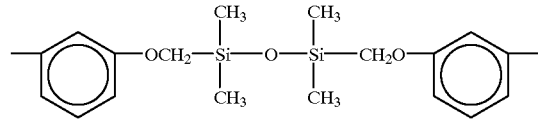

As described above, the polyimide precursor of the present invention is soluble in an alkaline aqueous solution because of its acidic groups A in the molecule. Although the acidic group A is preferably any of the substituents of the formulas (15) shown below, any acidic group other than these susbstituents may be used as the acidic group A. All the acidic groups A in the molecule may be the same, or different groups may be present in the molecule as the acidic groups A. Of the acidic groups of the formula (15) exemplified below, carboxyl group and hydroxyl group are especially preferable because of ease of synthesis.

Sulfonic acid group —$SO_3H$

Sulfinic acid group —$SO_2H$

Carboxyl group —COOH

Hydroxyl group —OH  (15)

The diamine residue $R^2$ to which the acidic group A is bonded is a trivalent or tetravalent organic group containing at least one aromatic ring, from the viewpoint of the mechanical properties, heat resistance and adhesive properties of a polyimide film obtained by curing. Preferable examples of the organic group $R^2$ are those represented by a series of the formulas (4) shown below. All the organic groups $R^2$ in the molecule may be the same, or different groups may be present in the molecule as the organic groups $R^2$.

(4)

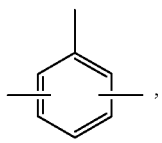

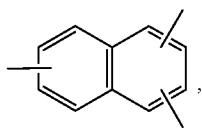

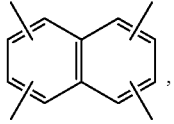

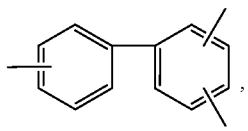

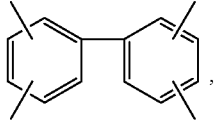

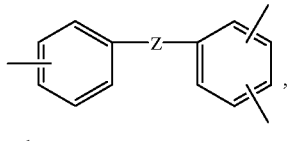

and

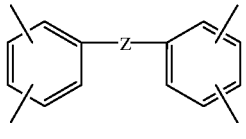

wherein Z is a group selected from the group consisting of —O—, —S—, —CO—, —SO—, —$CH_2$—, —$C(CF_3)_2$—,

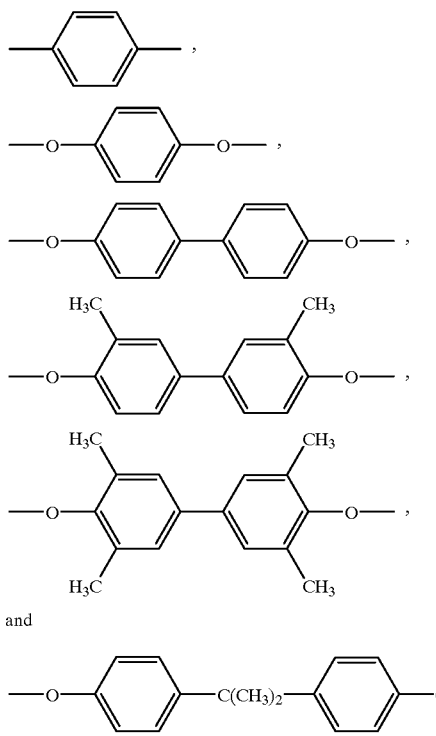

The diamine residue $R^4$ of the repeating unit of the formula (2) containing no acidic group A is a divalent organic group containing at least one aromatic ring and/or at least one silicon atom, from the viewpoint of the mechanical properties, heat resistance and adhesive properties of a polyimide film obtained by curing. Preferable examples of the organic group $R^4$ are those represented by a series of the formulas (7), (8) and (9) shown below. All the organic groups $R^4$ in the molecule may be the same, or different groups may be present in the molecule as the organic groups $R^4$.

(7)

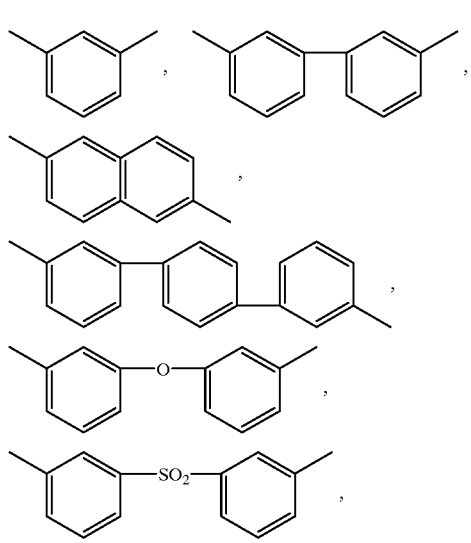

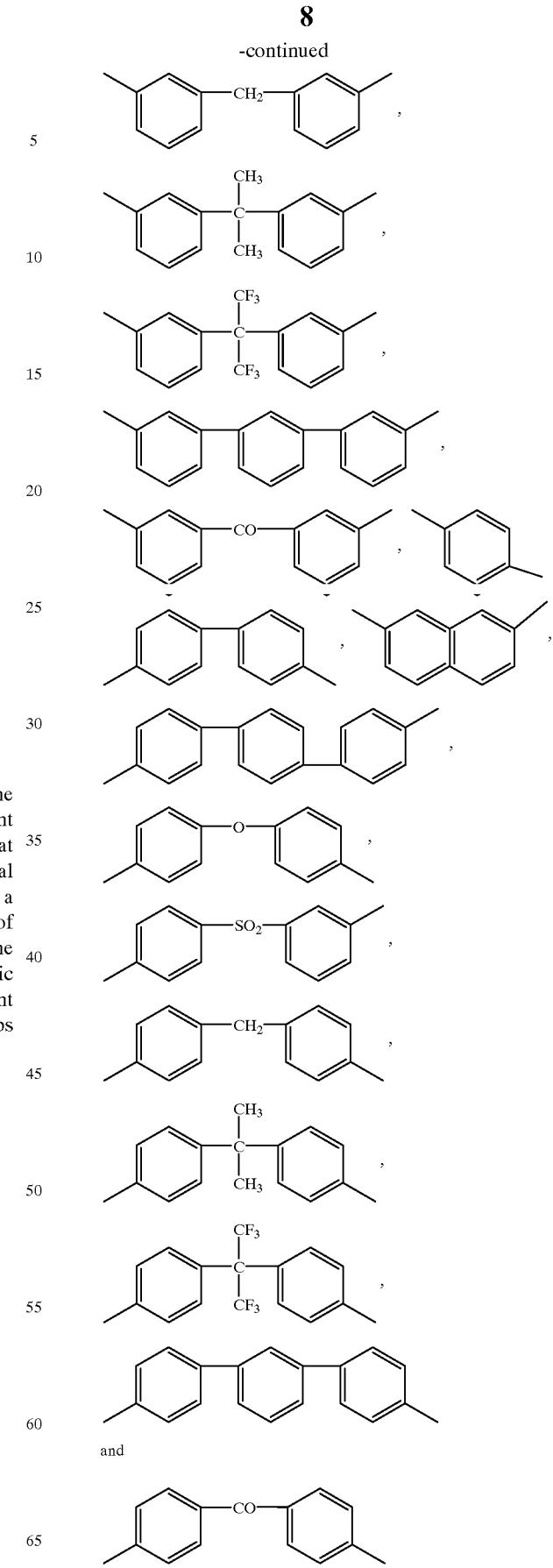

-continued

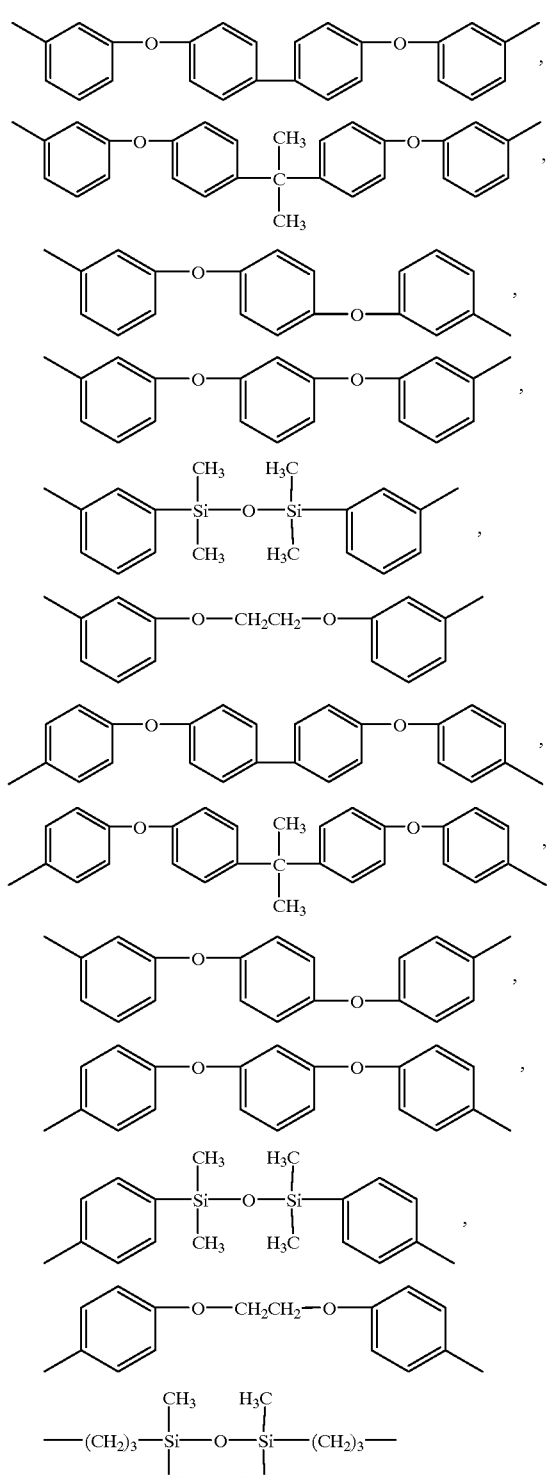

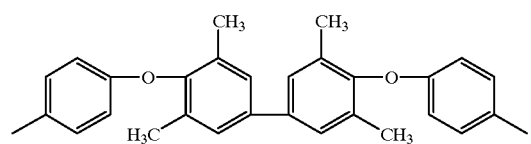

-continued

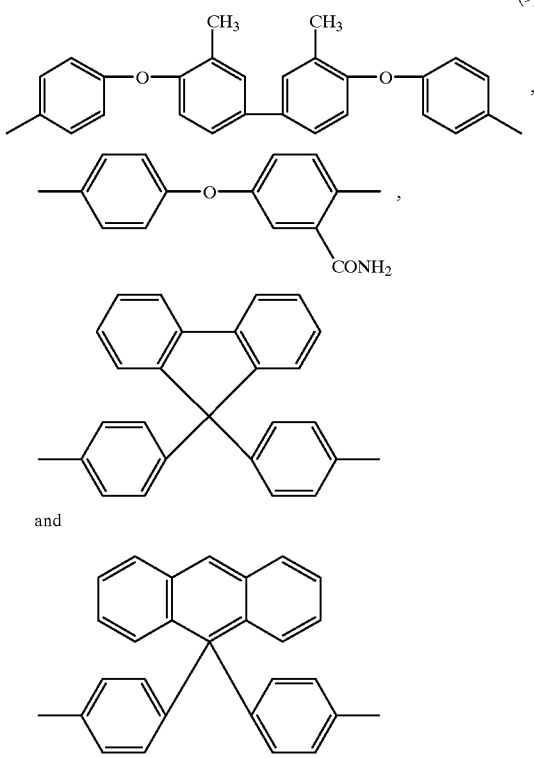

and

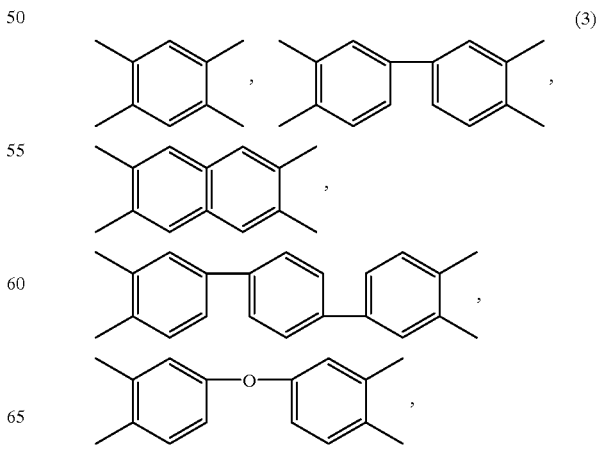

In the repeating units of the formulas (1) and (2) of the polyimide precursor of the present invention, $R^1$ is a tetravalent organic group containing 4 or more carbon atoms, from the viewpoint of the mechanical properties, heat resistance and adhesive properties of a polyimide film obtained by curing. Preferable examples of the organic group $R^1$ are those represented by a series of the formulas (3) shown below. All the organic groups $R^1$ in the molecule may be the same, or different groups may be present in the molecule as the organic groups $R^1$. Of the organic groups exemplified below, those having a biphenyl skeleton or a diphenylsulfone skeleton are preferable because when a pattern is formed using the photosensitive polyimide precursor containing such organic groups, the profile of the pattern is satisfactory.

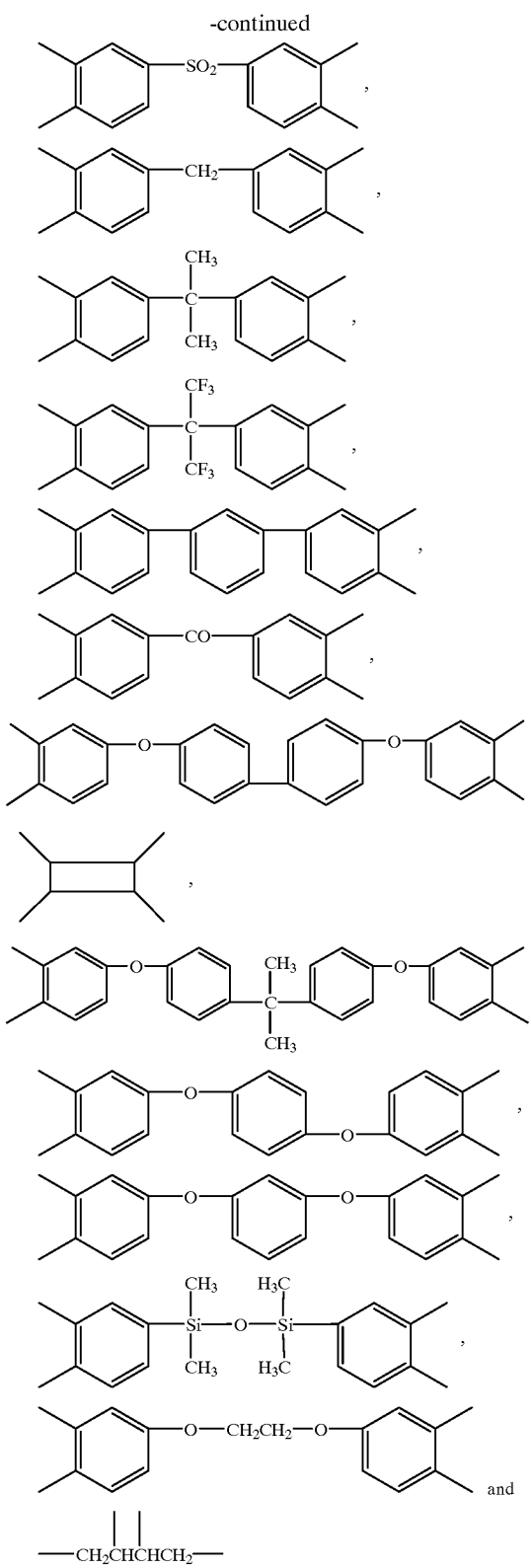

In the repeating units of the formulas (1) and (2) of the polyimide precursor of the present invention, $R^3$ is a monovalent organic group. In the polyimide precursor of the present invention, the linkage of $R^3$ to carboxyl group is an ester linkage and is advantageous in that it is stronger than ionic bond and is not severed even by dissolution in a solvent.

All the organic groups $R^3$ in the molecule may be the same, or different groups may be present in the molecule as the organic groups $R^3$. When 10 mol % or more of the organic groups $R^3$ in the molecule are photosensitive groups (e.g. groups removable by light irradiation), photosensitivity can be desirably imparted to the polyimide precursor. Examples of the photosensitive group are organic groups represented by the following formula (5), and two or more kinds of groups represented by the formula (5) may be present in the molecule:

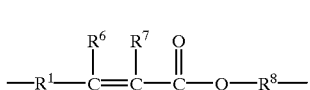
(5)

wherein $R^5$, $R^6$ and $R^7$ are independently a group selected from the group consisting of hydrogen, alkyl groups, phenyl group, vinyl group and propenyl group; and $R^8$ is a divalent organic group.

The groups represented by the formula (5) are preferable because they impart a high photosensitivity to the polyimide precursor. In particular, organic groups represented by the following formula (6) are preferable in the present invention because they realize a high sensitivity and moreover permit easy synthesis:

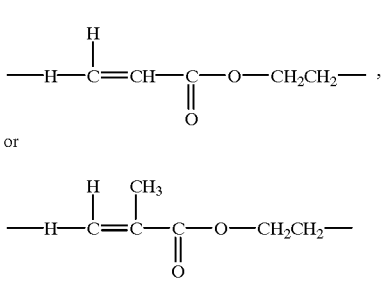
(6)

When some (preferably 10 mol % or more) of the groups $R^3$ are groups represented by the general formula (5), the remaining groups $R^3$ (i.e. preferably 0 to 90 mol %) are preferably alkyl groups having 6 or less carbon atoms. As the alkyl group, a methyl group, an ethyl group, an n-propyl group, an isopropyl group and an n-butyl group are especially suitable from the viewpoint point of the film properties of a polyimide obtained by curing the polyimide precursor.

As described above, the polyimide precursor of the present invention is used as a starting material for a negative-working photosensitive material the light exposed portion of which are cured. There are explained below components other than the polyimide precursor of the photosensitive polyimide precursor composition containing the polyimide precursor of the present invention.

The polyimide precursor composition of the present invention preferably contains a poly(amic acid) having siloxane skeletons and comprising repeating units represented by any of the above formulas (24). This siloxane-containing poly(amic acid) is effective in maintaining adhesive properties to a silicon wafer substrate after curing, in particular, high adhesive properties even after PCT (pressure cooker test) treatment. The poly(amic acid) having siloxane skeletons can be synthesized from an acid dianhydride and a diamine one or both of which have at least one siloxane skeleton. In the present invention, a siloxane-containing poly(amic acid) having a weight-average molecular weight of 10,000 to 200,000 is usually used.

The proportion of the siloxane-containing poly(amic acid) in the polyimide precursor composition of the present invention is preferably 1 to 30 parts by weight per 70 to 99 parts by weight of the polyimide precursor comprising repeating units of the above formula (1) (namely, containing acidic groups A), in order to improve the adhesive properties and not to impair the developability.

In the formulas (24) and the formula (25), $R^1$ is as defined in the above formula (1) and formula (2).

In the formulas (24), $R^{11}$ is a tetravalent organic group having at least one siloxane skeleton. From the viewpoint of the mechanical properties, heat resistance and adhesive properties of a polyimide film obtained by curing, preferable examples of the organic group $R^{11}$ are those represented by a series of the formulas (26) shown below. All the organic groups $R^{11}$ in the molecule may be the same, or different groups may be present in the molecule as the organic groups $R^{11}$.

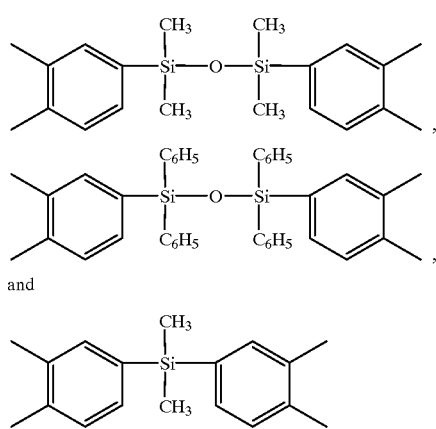

and

In the formulas (24), $R^{12}$ is a divalent organic group having at least one siloxane skeleton. From the viewpoint of the mechanical properties, heat resistance and adhesive properties of a polyimide film obtained by curing, preferable examples of the organic group $R^{12}$ are those represented by a series of the formulas (27) shown below. All the organic groups $R^{12}$ in the molecule may be the same, or different groups may be present in the molecule as the organic groups $R^{12}$.

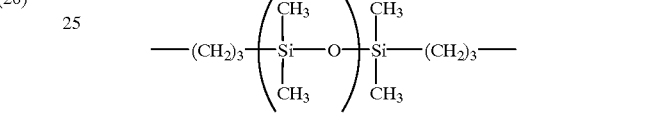

(27)

and wherein n is an integer of 2 to 12 . . . (27)

In the formulas (24) and the formula (25), the diamine residue $R^{13}$ is a divalent organic group containing at least one aromatic ring, from the viewpoint of the mechanical properties, heat resistance and adhesive properties of a polyimide film obtained by curing. Preferable examples of the organic group $R^{13}$ are those represented by the above formulas (7) and formulas (9) and a series of the formulas (36) shown below. All the organic groups $R^{13}$ in the molecule may be the same, or different groups may be present in the molecule as the organic groups $R^{13}$.

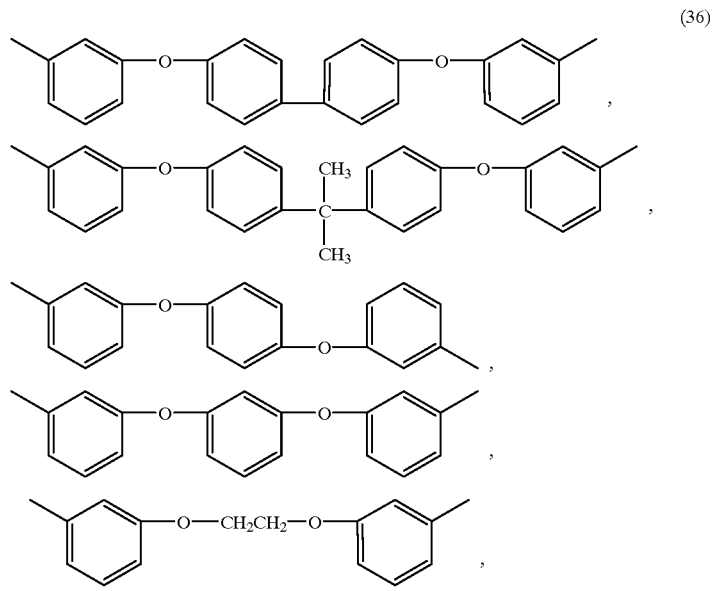

(36)

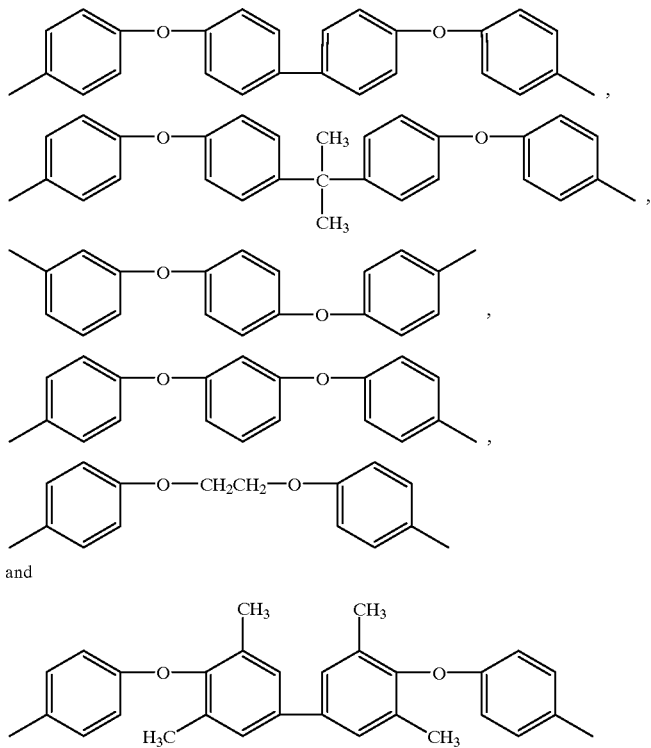

For attaining a practical photosensitivity, the photosensitive polyimide precursor composition of the present invention preferably contains at least one photosensitizer. Preferable examples of the photosensitizer are Michler's ketone, bis-4,4'-diethylaminobenzophenone, benzophenone, 3,5-bis(diethylaminobenzylidene)-N-methyl- 4-piperidone, 3,5-bis(dimethylaminobenzylidene)-N-methyl-4-piperidone, 3,5-bis(diethylaminobenzylidene)-N-ethyl-4-piperidone, 3,3'-carbonylbis(7-diethylamino)coumarin, riboflavin tetrabutyrate, 2-methyl-1-[4-(methylthio)phenyl]-2-morpholinopropan-1-one, 2,4-dimethylthioxanthone, 2,4-diethylthioxanthone, 2,4-diisopropylthioxanthone, 3,5-dimethylthioxanthone, 3,5-diisopropylthioxanthone, 1-phenyl-2-(ethoxycarbonyl)oxyiminopropan-1-one, benzoin ether, benzoin isopropyl ether, benzanthrone, 5-nitroacenaphthene, 2-nitrofluorene, anthrone, 1,2-benzanthraquinone, 1-phenyl-5-mercapto-1H-tetrazole, thioxanthen-9-one, 10-thioxanthenone, 3-acetylindole, 2,6-di(p-dimethylaminobenzal)-4-carboxycyclohexanone, 2,6-di(p-dimethylaminobenzal)-4-hydroxycyclohexanone, 2,6-di(p-diethylaminobenzal)-4-carboxycyclohexanone, 2,6-di(p-diethylaminobenzal)-4-hydroxycyclohexanone, 4,6-dimethyl-7-ethylaminocoumarin, 7-diethylamino-7-methylcoumarin, 7-diethylamino-3-(1-methylbenzoimidazolyl)coumarin, 3-(2-benzoimidazolyl)-7-diethylaminocoumarin, 3-(2-benzothiazolyl)-7-diethylaminocoumarin, 2-(p-dimethylaminostyryl)benzoxazole, 2-(p-dimethylaminostyryl)quinoline, 4-(p-dimethylaminostyryl)quinoline, 2-(p-dimethylaminostyryl)benzothiazole, 2-(p-dimethylaminostyryl)-3,3-dimethyl-3H-indole, etc. The photosensitizer is not limited to them.

The photosensitizer(s) is blended in an amount of preferably 0.1 to 50 parts by weight, more preferably 0.3 to 20 parts by weight, per 100 parts by weight of the polyimide precursor of the present invention. When the amount is outside the range of 0.1 to 50 parts by weight, no sensitizing effect can be obtained in some cases or an undesirable influence on the developability is brought about in some cases. As the photosensitizer(s), either one compound or a mixture of several compounds may be used.

For attaining a practical photosensitivity, the photosensitive polyimide precursor composition of the present invention preferably contains at least one photopolymerization assistant (or auxiliary agent). As the photopolymerization assistant, there can be used, for example, 4-diethylaminoethyl benzoate, 4-dimethylaminoethyl benzoate, 4-diethylaminopropyl benzoate, 4-dimethylaminopropyl benzoate, 4-dimethylaminoisoamyl benzoate, N-phenylglycine, N-methyl-N-phenylglycine, N-(4-cyanophenyl)glycine, 4-dimethylaminobenzonitrile, ethylene glycol dithioglycolate, ethylene glycol di(3-mercaptopropionate), trimethylolpropane thioglycolate, trimethylolpropane (3-mercaptopropionate), pentaerythritol tetrathioglycolate, pentaerythritol tetra(3-mercaptopropionate), trimethylolethane trithioglycolate, trimethylolpropane trithioglycolate, trimethylolethane tri(3-mercaptopropionate), dipentaerythritol hexa(3-mercaptopropionate), thioglycolic acid, α-mercaptopropionic acid, t-butyl peroxybenzoate, t-butyl peroxymethoxybenzoate, t-butyl peroxynitrobenzoate, t-butyl peroxyethylbenzoate, phenylisopropyl peroxybenzoate, di-t-butyl dibenzyloxyisophthalate, tri-t-butyl triperoxytrimelitate, tri-t-butyl triperoxytrimesitate, tetra-t-butyl tetraperoxypyromellitate, 2,5-dimethyl-2,5-di(benzoylperoxy)hexane, 3,3',4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone, 2,6-di(p-azidobenzal)-4-hydroxycyclohexanone, 2,6-di(p-azidobenzal)-4-carboxycyclohexanone, 2,6-di(p-azidobenzal)-4-methoxycyclohexanone, 2,6-di(p-azidobenzal)-4-hydroxymethylcyclohexanone, 3,5-di(p- azidobenzal)-1-methyl-4-piperidone, 3,5-di(p-azidobenzal)-4-piperidone, 3,5-di(p-azidobenzal)-N-acetyl-4-piperidone, 3,5-di(p-azidobenzal)-N-methoxycarbonyl-4-piperidone, 2,6-di(m-azidobenzal)-4-hydroxycyclohexanone, 2,6-di(m-azidobenzal)-4-carboxycyclohexanone, 2,6-di(m-azidobenzal)-4-methoxycyclohexanone, 2,6-di(m-azidobenzal)-4-hydroxymethylcyclohexanone, 3,5-di(m-azidobenzal)-N-methyl-4-piperidone, 3,5-di(m-azidobenzal)-4-piperidone, 3,5-di(m-azidobenzal)-N-acetyl-4-piperidone, 3,5-di(m-azidobenzal)-N-methoxycarbonyl-4-piperidone, 2,6-di(p-azidocinnamylidene)-4-hydroxycyclohexanone, 2,6-di(p-azidocinnamylidene)-4-carboxycyclohexanone, 2,6-di(p-azidocinnamylidene)-4-hydroxymethylcyclohexanone, 3,5-di(p-azidocinnamylidene)-N-methyl-4-piperidone, 4,4'-diazidochalcone, 3,3'-diazidochalcone, 3,4'-diazidochalcone, 4,3'-diazidochalcone, 1,3-diphenyl-1,2,3-propanetrione-2-(o-acetyl)oxime, 1,3-diphenyl-1,2,3-propanetrione-2-(o-n-propylcarbonyl)oxime, 1,3-diphenyl-1,2,3-propanetrione-2-(o-methoxycarbonyl)oxime, 1,3-diphenyl-1,2,3-propanetrione-2-(o-ethoxycarbonyl)oxime, 1,3-diphenyl-1,2,3-propanetrione-2-(o-benzoyl)oxime, 1,3-diphenyl-1,2,3-propanetrione-2-(o-phenyloxycarbonyl)oxime, 1,3-bis(p-methylphenyl)-1,2,3-propanetrione-2-(o-benzoyl)-oxime, 1,3-bis(p-methoxyphenyl)-1,2,3-propanetrione-2-(o-ethoxycarbonyl)oxime, 1-(p-methoxyphenyl)-3-(p-nitrophenyl)-1,2,3-propanetrione-2-(o-phenyloxycarbonyl)oxime, and other agents of the same class.

The photopolymerization assistant(s) is blended in an amount of preferably 0.1 to 50 parts by weight, more preferably 0.3 to 20 parts by weight, per 100 parts by weight of the polyimide precursor of the present invention. When the amount is outside the range of 0.1 to 50 parts by weight, no sensitizing effect can be obtained in some cases or an undesirable influence on the developability is brought about in some cases. As the photopolymerization assistant(s), either one compound or a mixture of several compounds may be used.

For attaining a practical photosensitivity, the photosensitive polyimide precursor composition of the present invention may futher contain at least one comonomer in addition to the above-mentioned photosensitizer(s) and photopolymerization assistant(s). The comonomer is a compound having a carbon-carbon double bond and facilitates the photopolymerization. Preferable examples of the comonomer are 1,6-hexanediol diacrylate, neopentylglycol diacrylate, ethylene glycol diacrylate, pentaerythritol diacrylate, trimethylolpropane triacrylate, pentaerythritol triacrylate, dipentaerythritol hexaacrylate, tetramethylolpropane tetraacrylate, tetraethylene glycol diacrylate, 1,6-hexanediol dimethacrylate, neopentylglycol dimethacrylate, ethylene glycol dimethacrylate, pentaerythritol dimethacrylate, trimethylolpropane trimethacrylate, pentaerythritol trimethacrylate, dipentaerythritol hexamethacrylate, tetramethylolpropane tetramethacrylate, tetraethylene glycol dimethacrylate, etc. The comonomer is not limited to them.

The comonomer(s) is blended in an amount of preferably 1 to 100 parts by weight, more preferably 3 to 50 parts by weight, per 100 parts by weight of the polyimide precursor of the present invention. When the amount is outside the range of 1 to 100 parts by weight, no desired effect can be obtained in some cases or an undesirable influence on the developability is brought about in some cases. As the comonomer(s), either one compound or a mixture of several compounds may be used.

The photosensitive polyimide precursor composition of the present invention may contain a suitable organic solvent. When the composition is in the form of a solution in the suitable solvent, it can be used as a varnish and is hence convenient when formed into a film. As the solvent, aprotic polar solvents are preferable from the viewpoint of solubility. Specific preferable examples of the solvent are N-methyl-2-pyrrolidone, N-acetyl-2-pyrrolidone, N-benzyl-2-pyrrolidone, N,N-dimethylformamide, N,N-dimethylacetamide, dimethyl sulfoxide, hexamethylphosphoric triamide, N-acetyl-$\epsilon$-caprolactam, dimethylimidazolidinone, diethylene glycol dimethyl ether, triethylene glycol dimethyl ether, $\gamma$-butyrolactone, etc. These may be used singly or as a mixture thereof. The organic solvent may be either a solvent left as it is after being used for the synthesis of the polyimide precursor, or a solvent freshly added to the polyimide precursor isolated. For improving the coating properties, a solvent such as toluene, xylene, diethyl ketone, methoxybenzene, cyclopentanone or the like may be incorporated into the composition so long as it has no undesirable influence on the solubility of the polymer. Particularly when cyclopentanone is used as the solvent, a photosensitive polyimide precursor composition excellent in coating properties for a silicon wafer can be obtained.

The process for forming a resin pattern of the present invention comprises forming a polyimide film composed of a cured product of the photosensitive polyimide precursor of the present invention, by a photolithographic technique.

In the formation process of a resin pattern of the present invention, a coating film of the photosensitive polyimide precursor composition of the present invention is formed on the surface of a substrate at first. In this formation process, the substrate surface may be previously treated with an adhesion assistant in order to improve the adhesion strength between the substrate and the coating film or a polyimide film obtained by curing by heating. It is also possible to add an adhesion assistant to a varnish of the photosensitive polyimide precursor composition previously.

The coating film of the photosensitive polyimide precursor composition is formed, for example, by forming a film of a varnish of the photosensitive polyimide precursor composition, and drying this film. The film of the varnish is formed by a means properly selected from means such as spin-coating using a spinner, immersion, spray printing, screen printing, etc., depending on the viscosity of the varnish, etc. The thickness of the coating film can be adjusted by the coating conditions, the solid concentration in the composition, etc. The above-mentioned coating film may be obtained by forming a coating film of the polyimide precursor composition on a support previously, preparing a sheet of the composition by peeling the coating film from the support, and attaching this sheet to the surface of the above-mentioned substrate.

Then, the coating film is irradiated with light (usually ultraviolet light) through a photomask having a predetermined pattern, after which the non-exposed portion is dissolved away with an alkaline aqueous solution to obtain a desired relief pattern. This developing step may be carried out using a conventional positive type photoresist developing apparatus.

In the formation process of a resist pattern of the present invention, an alkaline aqueous solution is used as a developing solution. The developing solution may be either an aqueous solution of one compound or an aqueous solution of two or more compounds so long as it is alkaline. The alkaline aqueous solution is usually a solution prepared by dissolving one or more basic compounds in water. Although the concentration of the basic compound(s) is usually 0.1 to 50 wt/wt %, it is preferably 0.1 to 30 wt/wt % in view of influences on the substrate, etc. For improving the solubility of the polyimide precursor, the developing solution may further contain water-soluble organic solvents such as methanol, ethanol, propanol, isopropanol, N-methyl-2-pyrrolidone, N,N-dimethylformamide, N,N-dimethylacetamide, etc.

The aforesaid basic compounds include, for example, hydroxides or carbonates of alkali metals, alkaline earth metals or ammonium ion, and amine compounds. Specific preferable examples of the basic compounds are 2-dimethylaminoethanol, 3-dimethylamino-1-propanol, 4-dimethylamino-1-butanol, 5-dimethylamino-1-pentanol, 6-dimethylamino-1-hexanol, 2-dimethylamino-2-methyl-1-propanol, 3-dimethylamino-2,2-dimethyl-1-propanol, 2-diethylaminoethanol, 3-diethylamino-1-propanol, 2-diisopropylaminoethanol, 2-di-n-butylaminoethanol, N,N-dibenzyl-2-aminoethanol, 2-(2-dimethylaminoethoxy)ethanol, 2-(2-diethylaminoethoxy)ethanol, 1-dimethylamino-2-propanol, 1-diethylamino-2-propanol, N-methyldiethanolamine, N-ethyldiethanolamine, N-n-butyldiethanolamine, N-t-butyldiethanolamine, N-lauryldiethanolamine, 3-diethylamino-1,2-propanediol, triethanolamine, triisopropanolamine, N-methylethanolamine, N-ethylethanolamine, N-n-butylethanolamine, N-t-butylethanolamine, diethanolamine, diisopropanolamine, 2-aminoethanol, 3-amino-1-propanol, 4-amino-1-butanol, 6-amino-1-hexanol, 1-amino-2-propanol, 2-amino-2,2-dimethyl-1-propanol, 1-aminobutanol, 2-amino-1-butanol, N-(2-aminoethyl)ethanolamine, 2-amino-2-methyl-1,3-propanediol, 2-amino-2-ethyl-1,3-propanediol, 3-amino-1,2-propanediol, 2-amino-2-hydroxymethyl-1,3-propanediol, sodium hydroxide, potassium hydroxide, ammonium hydroxide, sodium carbonate, potassium carbonate, ammonium carbonate, sodium hydrogencarbonate, potassium hydrogencarbonate, ammonium hydrogencarbonate, tetramethylammonium hydroxide, tetraethylammonium hydroxide, tetrapropylammonium hydroxide, tetraisopropylammonium hydroxide, aminomethanol, 2-aminoethanol, 3-aminopropanol, 2-aminopropanol, methylamine, ethylamine, propylamine, isopropylamine, dimethylamine, diethylamine, dipropylamine, diisopropylamine, trimethylamine, triethylamine, tripropylamine, triisopropylamine, etc. Any compound other than those exemplified above may be used so long as it is water-soluble and its aqueous solution is alkaline.

The relief pattern formed by the development is then washed with a rinsing liquid to be freed of the developing solution. Preferable examples of the rinsing liquid are methanol, ethanol, isopropanol, water, etc. which are sufficiently miscible with the developing solution.

The relief pattern obtained by the above-mentioned treatment is heat-treated at a temperature chosen in the range of 150° C. to 450° C., whereby a resist pattern made of the polyimide of the present invention can be obtained with high resolution. This resist pattern has a high heat resistance and excellent mechanical properties.

The present invention is illustrated by way of the following Examples.

EXAMPLE 1

A. Synthesis of a Polyimide Precursor (1) Synthesis of an acid chloride

When 9.42 g (0.032 mol) of 3,3',4,4'-biphenyltetracarboxylic dianhydride (BPDA), 8.32 g (0.064 mol) of 2-hydroxyethyl methacrylate (HEMA), 5.06 g (0.064 mol) of pyridine, 0.03 g of t-butylcatechol and 70 ml of N-methyl-2-pyrrolidone (NMP) were placed in a 200-ml four-necked flask and stirred at 60° C., a transparent solution was obtained in 2 hours. This solution was then stirred at room temperature for 7 hours, after which 9.88 g (0.083 mol) of thionyl chloride was added dropwise over a period of 10 minutes while cooling the flask with ice. The resulting mixture was stirred at room temperature for 1 hour to obtain a solution containing an acid chloride.

(2) Synthesis of a polyimide precursor [a poly(amic acid) ester]

In another 200-ml four-necked flask were placed 4.72 g (0.031 mol) of 3,5-diaminobenzoic acid, 5.06 g (0.064 mol) of pyridine, 0.03 g of t-butyl-catechol and 50 ml of N-methyl-2-pyrrolidone (NMP), after which the acid chloride solution obtained in section (1) above was slowly dropped in the flask with stirring over a period of 1 hour while cooling the flask with ice (while maintaining the temperature at 10° C. or lower). The resulting mixture was stirred at room temperature for 1 hour and poured into 1 liter of water, and the polymer precipitated was collected by filtration, washed twice with water and then dried in vacuo to obtain 22 g of a poly(amic acid) ester comprising repeating units of the formula (16) shown below. The weight-average molecular weight of the poly(amic acid) ester was measured by GPC (gel permeation chromatography) and found to be 44,000 in terms of polystyrene.

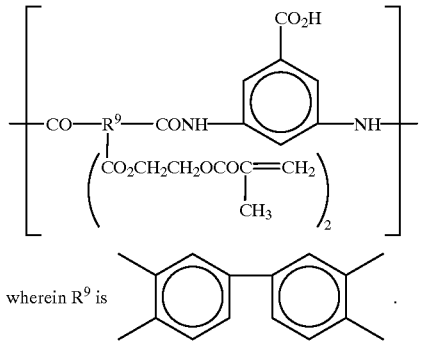

$H^1$-NMR (proton nuclear magnetic resonance) spectrum of the obtained polyimide precursor was measured to obtain peaks at 1.82 ppm (s, 6H, —CH3), 4.37–4.51 ppm (d, 8H, —CH$_2$—), 5.59–5.98 ppm (d, 4H, =CH$_2$), 7.84–8.38 ppm (m, 9H, aromatic ring) and 10.79 ppm (s, 2H, —NH—). In the measurement, dimethyl sulfoxide-d$_6$ was used as a solvent. The chart obtained is shown in FIG. 1. In the chart, it can be speculated that the peaks at 2.15 ppm and 2.67 ppm are due to the remaining solvent for synthesis (NMP) and the peak at 3.27 ppm due to water as a contaminant.

B. Preparation of a Polyimide Precursor Composition

In a mixture of 15.0 g of γ-butyrolactone and 7.5 g of N,N-dimethylacetamide were dissolved 10 g of the obtained polymer and then 100 mg of 3,5-bis(4-diethylaminobenzylidene)-1-methyl-4-azacyclohexanone and 200 mg of 4-diethylaminoethyl benzoate, and the resulting solution was filtered through a filter with a pore size of 5 μm under pressure to obtain a photosensitive polyimide precursor composition in the form of a solution.

C. Evaluation of a Polyimide Film

The obtained solution was spin-coated on a silicon wafer with a spinner and then dried on a hot plate of 90° C. for 3 minutes to obtain a coating film in 15 μm thickness. The coating film was exposed to light from a 500-W high pressure mercury arc lamp at an exposure dose of 200 mJ/cm2 (ultraviolet light intensity at 365 nm), developed by immersion in a 2.38 wt % aqueous tetramethylammonium hydroxide solution (a developing solution) of 20° C. for 1 minute, and then rinsed with water to obtain a semi-cured polyimide precursor film.

This film was cured by heating at 200° C. for 30 minutes and then at 400° C. for 60 minutes, to obtain a film of 10 μm thickness made of a polyimide comprising repeating units of the following formula (17):

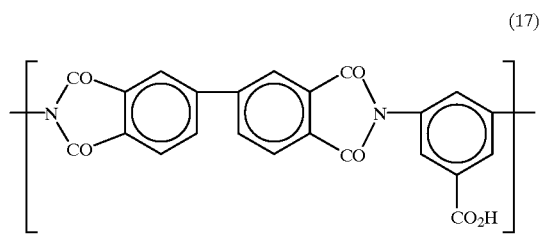

This polyimide film was peeled from the silicon wafer and its elongation was measured and found to be as good as 9%. The dependence of the film thickness after the development on the exposure dose was measured to find that the sensitivity was 80 mJ/cm² when the sensitivity was defined as an exposure dose at which the film thickness after the development became one-half of the coating thickness.

When a polyimide film of 2 to 3 μm thick was formed and its infrared absorption spectrum was measured, there were observed an absorption due to imide group at 1780 cm⁻¹ and an absorption due to carboxyl group at 2800 to 3600 cm⁻¹.

D. Formation of a Resin Pattern

The polyimide precursor composition prepared in step B was coated, exposed, developed and then rinsed in the same manner as described in the above-mentioned polyimide film formation, except that in the exposure, the coating film was closely covered with a photomask patterned with stripes of 10 μm wide. Thus, there was obtained a relief pattern of 10 μm wide made of semi-cured polyimide precursor and having sharp edge faces. This pattern was heat-treated in the same manner as in the above-mentioned polyimide film formation to obtain a resin pattern made of polyimide.

EXAMPLE 2

A. Synthesis of a Polyimide Precursor (1) Synthesis of an acid chloride

When 10.00 g (0.032 mol) of 4,4'-oxydiphthalic dianhydride (ODPA), 8.32 g (0.064 mol) of 2-hydroxyethyl methacrylate (HEMA), 5.06 g (0.064 mol) of pyridine, 0.03 g of t-butylcatechol and 70 ml of N-methyl-2-pyrrolidone (NMP) were placed in a 200-ml four-necked flask and stirred at 60° C., a transparent solution was obtained in 30 minutes. This solution was then stirred at room temperature for 6 hours, after which 9.88 g (0.083 mol: 1.3 equivalents) of thionyl chloride was added dropwise over a period of 10 minutes while cooling the flask with ice. The resulting mixture was stirred at room temperature for 1 hour to obtain an acid chloride solution.

(2) Synthesis of a polyimide precursor [a poly(amic acid) ester]

In another 200-ml four-necked flask were placed 4.72 g (0.031 mol) of 3,5-diaminobenzoic acid, 5.06 g (0.064 mol) of pyridine, 0.03 g of t-butyl-catechol and 50 ml of N-methyl-2-pyrrolidone (NMP), after which the acid chloride solution obtained in section (1) above was slowly dropped in the flask with stirring over a period of 1 hour while cooling the flask with ice (while maintaining the temperature at 10° C. or lower). The resulting mixture was stirred at room temperature for 1 hour and poured into 1 liter of water, and the polymer precipitated was collected by filtration, washed twice with water and then dried in vacuo to obtain 20 g of a poly(amic acid) ester comprising repeating units of the formula (18) shown below. The weight-average molecular weight of this polymer was measured by GPC (gel permeation chromatography) and found to be 39,000 in terms of polystyrene.

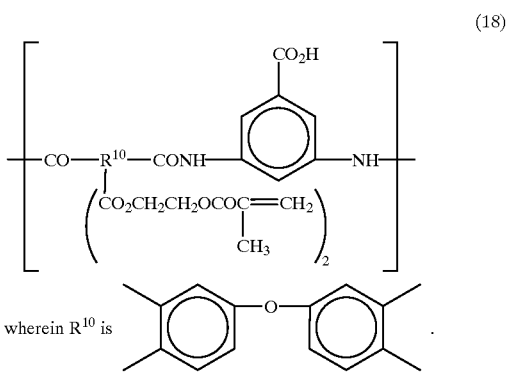

Figure 2:
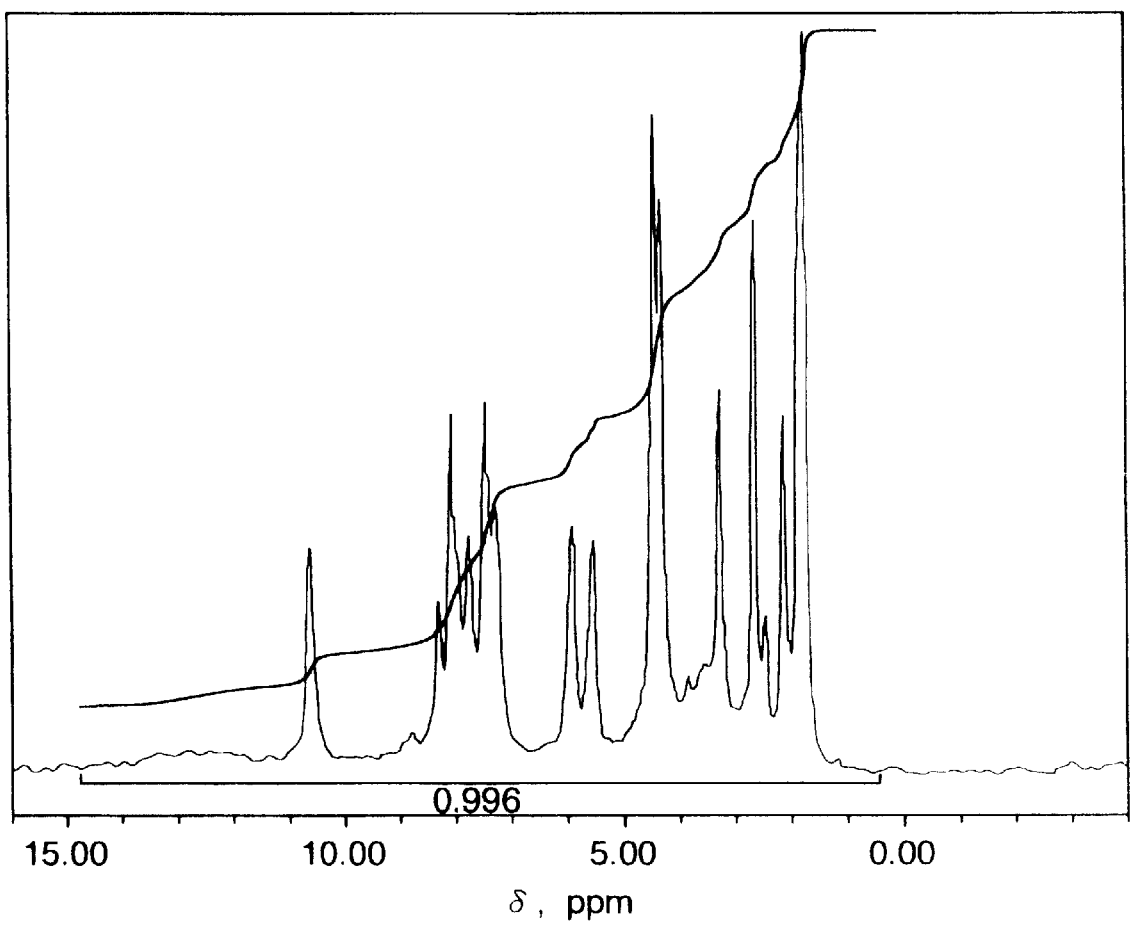
FIG. 2 is a $^1$H NMR chart of the polyimide precursor obtained in Example 2.

H¹-NMR (proton nuclear magnetic resonance) spectrum of the obtained polyimide precursor was measured to obtain peaks at 1.79 ppm (s, 6H, —CH₃), 4.32–4.45 ppm (d, 8H, —CH₂—), 5.56–5.94 ppm (d, 4H, =CH₂), 7.30–8.32 ppm (m, 9H, aromatic ring) and 10.69 ppm (s, 2H, —NH—). In the measurement, dimethyl sulfoxide-d₆ was used as a solvent. The chart obtained is shown in FIG. 2. In the chart, it can be speculated that the peaks at 2.15 ppm and 2.67 ppm are due to the remaining solvent for synthesis (NMP) and the peak at 3.27 ppm due to water as a contaminant.

B. Preparation of a Photosensitive Polyimide Precursor Composition

In a mixture of 15.0 g of γ-butyrolactone and 7.5 g of N,N-dimethylacetamide were dissolved 10 g of the obtained polymer and then 100 mg of Michler's ketone and 200 mg of 1,3-diphenyl-1,2,3-propanetrione-2-(o-ethoxycarbonyl) oxime, and the resulting solution was filtered through a filter with a pore size of 5 μm under pressure to obtain a photosensitive polyimide precursor composition in the form of a solution.

C. Evaluation of a Polyimide Film

The obtained solution was spin-coated on a silicon wafer with a spinner and then dried on a hot plate of 90° C. for 3 minutes to obtain a coating film of 15 μm thick. The coating film was exposed to light from a 500-W high pressure mercury arc lamp at an exposure dose of 200 mJ/cm2 (ultraviolet light intensity at 365 nm). After the exposure, the coating film was developed by immersion in a 2.38 wt % aqueous tetramethylammonium hydroxide solution (a developing solution) of 20° C. for 1 minute and then rinsed with water to obtain a semi-cured polyimide precursor film.

This film was cured by heating at 200° C. for 30 minutes and then at 400° C. for 60 minutes, to obtain a film of 10 μm thick made of a polyimide comprising repeating units of the following formula (19):

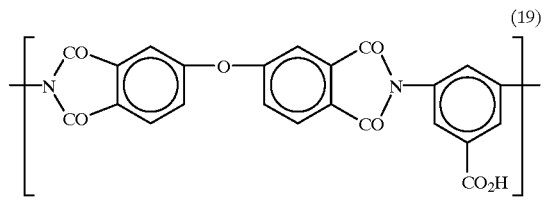

(19)

This polyimide film was peeled from the silicon wafer and its elongation was measured and found to be as good as 10%. The dependence of the film thickness after the development on the exposure dose was measured to find that the sensitivity was 90 mJ/cm$^2$ when the sensitivity was defined as an exposure dose at which the film thickness after the development became one-half of the coating thickness.

When a polyimide film of 2 to 3 μm thick was formed and its infrared absorption spectrum was measured, there were observed an absorption due to imide group at 1785 cm$^{-1}$ and an absorption due to carboxyl group at 2800 to 3600 cm$^{-1}$.

D. Formation of a Resin Pattern

The polyimide precursor composition prepared in step B was coated, exposed, developed and then rinsed in the same manner as described in the formation of the polyimide film in step C in this Example, except that in the exposure, the coating film was closely covered with a photomask patterned with stripes of 10 μm wide. Thus, there was obtained a relief pattern of 10 μm wide made of semi-cured polyimide precursor and having sharp edge faces. This pattern was heat-treated in the same manner as in the above-mentioned polyimide film formation to obtain a resin pattern made of polyimide, with high precision.

EXAMPLES 3 to 10

Acid chlorides of tetracarboxylic acid diesters were synthesized in the same manner as described in Example 1 except for using the acid dianhydride and OH component (alcohol) listed in Table 1 and Table 2. Polyimide precursors were synthesized by reacting each acid chloride with the diamines listed in Table 1 and Table 2 under the same reaction conditions as described in Example 1. The weight-average molecular weights of the obtained polyimide precursors were 20,000 to 40,000. The repeating units of the polyimide precursors are shown in Table 3 and Table 4.

TABLE 1

Compositios of photosensitive polyimide precursors

| Example | Acid dianhydride (molar ratio) | Diamine (molar ratio) | OH component (molar ratio) |
|---|---|---|---|
| 3 | 3,3',4,4'-Biphenyl-tetracarboxylic dianhydride (100) | 3,5-Diaminobenzoic acid (50) 4,4'-Diamino-diphenyl ether (50) | 2-Hydroxy-ethyl methacrylate (200) |
| 4 | 3,3',4,4'-Biphenyl-tetracarboxylic dianhydride (100) | 3,5-Diaminobenzoic acid (70) 4,4'-Diamino-diphenyl ether (30) | 2-Hydroxy-ethyl methacrylate (200) |
| 5 | 3,3',4,4'-Biphenyl-tetracarboxylic dianhydride (100) | 2,4-Diaminophenol (95) Bis(3-amino-propyl)tetramethyl disiloxane (5) | 2-Hydroxy-ethyl methacrylate (200) |
| 6 | 3,3',4,4'-Biphenyl-tetracarboxylic dianhydride (100) | 4,4'-Diamino-3,3-dihydroxybiphenyl (50) 4,4'-Diamino-diphenyl ether (50) | 2-Hydroxy-ethyl methacrylate (200) |

TABLE 2

Compositions of photosensitive poiyimide precursors

| Example | Acid dianhydride (molar ratio) | Diamine (molar ratio) | OH component (molar ratio) |
|---|---|---|---|
| 7 | 4,4'-Oxydi-phthalic dianhydride (100) | 3,5-Diaminobenzoic acid (50) 4,4'-Diamino-diphenyl ether (50) | 2-Hydroxy-ethyl methacrylate (200) |
| 8 | 4,4'-Oxydi-phthalic dianhydride (100) | 3,5-Diaminobenzoic acid (70) 4,4'-Diamino-phenyl ether (30) | 2-Hydroxy-ethyl methacrylate (200) |
| 9 | 4,4'-Oxydi-phthalic dianhydride (100) | 2,4-Diaminophenol (95) Bis(3-aminopropyl)-tetramethyldi-siloxane (5) | 2-Hydroxy-ethyl methacrylate (200) |
| 10 | 4,4'-Oxydi-phthalic dianhydride (100) | 4,4'-Diamino-3,3-dihydroxybiphenyl (50) 4,4'-Diamino-diphenyl ether (50) | 2-Hydroxy-ethyl methacrylate (200) |

TABLE 3

| Example | Repeating unit (mol %) | |
|---|---|---|
| 3, 7 | 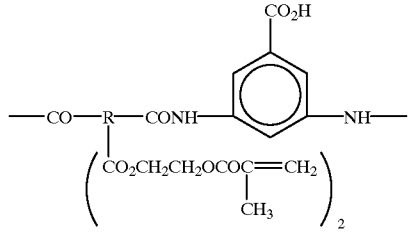 (50) | 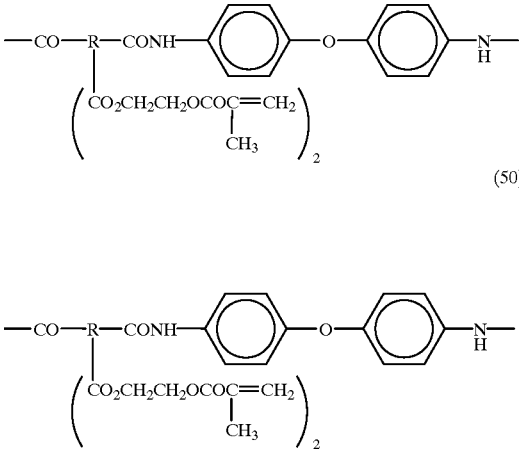 (50) |
| 4, 8 | 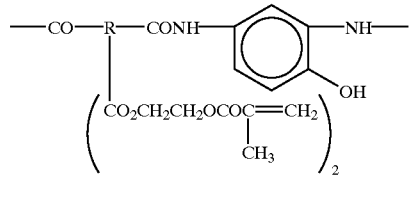 (70) | 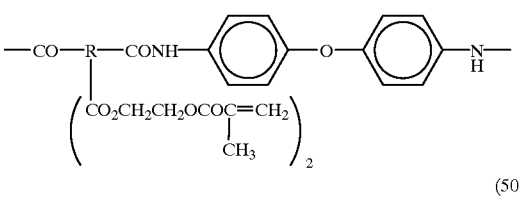 (30) |

TABLE 4

| Example | Repeating unit (mol %) | |
|---|---|---|
| 5, 9 | (95) | (5) |
| 6, 10 | (50) | (50) |

In the structural formulas shown in Table 3 and Table 4, R is a group represented by the following formula (20) in Examples 3 to 6 or a group represented by the following formula (21) in Examples 7 to 10. The numbers in the patentheses in Tables 3 and 4 denote the percentage (mol %) of each kind of repeating units based on the total number of moles of repeating units in a molecule of the polyimide precursor.

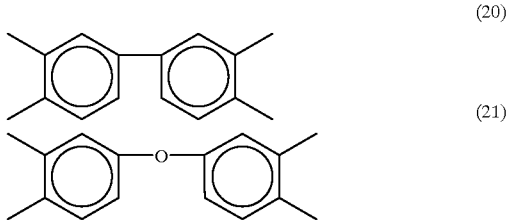

(20)

(21)

In the same manner as in Example 1, each of the obtained polyimide precursors was dissolved in a solvent, and a photosensitizer and a photopolymerization assistant were added (a comonomer was further added in Examples 6 and 10) thereto to prepare a photosensitive polyimide precursor composition. A film was formed from this composition in the same manner as described in Example 1, and the resolution, sensitivity, development time, elongation of the film, and adhesive properties of the film were investigated. The results obtained are shown in Table 5 and Table 6. In Table 5 and Table 6, the amount of each additive added per 100 parts by weight of the photosensitive polyimide precursor is shown in the parentheses.

The film formation conditions and the evaluation conditions were the same as those described in Example 1. The film thickness was adjusted to 10 to 20 μm. The resolution was rated as good when a through-hole of 10 μm was resolved. The sensitivity was rated as good when an exposure dose at which the film thickness after the development became one-half of the coating thickness was 100 mJ/cm$^2$ or less. The development time was rated good when the development could be carried out within 1 minute with a 2.38 wt % aqueous tetramethylammonium hydroxide solution as a developing solution. The film elongation was rated as good when the elongation of a finally obtained polyimide film was 8% or more. The adhesive properties were rated good when no peeling was observed in pressure-sensitive adhesive tape

TABLE 5

Evaluation of characteristics of photosensitive polyimide precursors

| Example | Photosensitizer (parts by weight) | Photopolymerization assistant (parts by weight) | Comonomer (parts by weight) | Resolution | Sensitivity | Development time | Elongation | Adhesive properties |
|---|---|---|---|---|---|---|---|---|
| 3 | Michler's hetone (1) | N-phenylglycine (2) | None | Good | Good | Good | Good | Good |
| 4 | 7-Diethylamino-4-methyl-coumarin (2) | 3,3',4,4'-Tetra(t-butyl-peroxycarbomyl-benzophenone (2) | None | Good | Good | Good | Good | Good |
| 5 | Benzanthrone (0.5) | 4-Diethylamino-ethylbenzoate (1) | None | Good | Good | Good | Good | Good |
| 6 | 2,6-Di (p-di-methylamino-benzal)-4-carboxycyclo-hexanone (2) | 2,6-Di-(p-azidobenzal)-4-carboxycyclo-hexanone (2) | Tetraethylene glycol dimethacrylate (5) | Good | Good | Good | Good | Good |

TABLE 6

Evaluation of characteristics of photosensitive polyimide precursors

| Example | Photosensitizer (parts by weight) | Photopolymerization assistant (parts by weight) | Comonomer (parts by weight) | Resolution | Sensitivity | Development time | Elongation | Adhesive properties |
|---|---|---|---|---|---|---|---|---|
| 7 | Michler's hetone (1) | N-phenylglycine (2) | None | Good | Good | Good | Good | Good |
| 8 | 7-Diethylamino-4-methyl-coumarin (2) | 3,3',4,4'-Tetra(t-butyl-peroxycarbomyl-benzophenone (2) | None | Good | Good | Good | Good | Good |
| 9 | Benzanthrone (0.5) | 4-Diethylamino-ethylbenzoate (1) | None | Good | Good | Good | Good | Good |
| 10 | 2,6-Di (p-di-methylamino-benzal)-4-carboxycyclo-hexanone (2) | 2,6-Di-(p-azidobenzal)-4-carboxycyclo-hexanone (2) | Tetraethylene glycol dimethacrylate (5) | Good | Good | Good | Good | Good | test (JIS D-0202) on the polyimide film on a silicon wafer which had been finally obtained by curing by heating.

EXAMPLES 11 to 12

Acid chlorides of tetracarboxylic acid diesters were synthesized in the same manner as described in Example 1 except for using the acid dianhydride mixture and OH component and alcohol mixture listed in Table 7. Polyimide precursors comprising the repeating units shown in Table 8 were synthesized by adding the diamine mixture listed in Table 7 to a solution of each acid chloride, and reacting the diamine mixture with the acid chloride in the same manner as described in Example 1. The weight-average molecular weights of the obtained polyimide precursors were 20,000 to 40,000.

TABLE 7

Compositions of photosensitive polyimide precursors

| Example | Acid dianhydride (molar ratio) | Diamine (molar ratio) | OH component (molar ratio) |
|---|---|---|---|
| 11 | 3,3',4,4'-Biphenyl-tetracarboxylic dianhydride (50) Pyromellitic dianhydride (50) | 3,5-Diaminobenzoic acid (50) 4,4'-Diamino-diphenyl ether (50) | 2-Hydroxy-ethyl methacrylate (100) Ethanol (100) |
| 12 | 4,4'-Oxydiphthalic dianhydride (50) Pyromellitic dianhydride (50) | 3,5-Diaminobenzoic acid (50) 4,4'-Diamino-diphenyl ether (50) | 2-Hydroxy-ethyl methacrylate (100) Ethanol (100) |

Example 12. The numbers in the patentheses in Table 8 denote the percentage (mol %) of each kind of repeating units based on the total number of moles of repeating units in a molecule of the polyimide precursor.

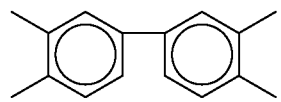
(22)

and

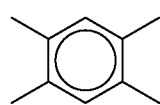

(23)

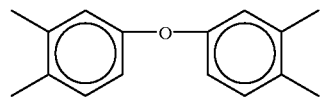

and

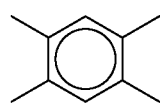

In the same manner as in Example 1, each of the obtained polyimide precursors was dissolved in a solvent, and a photosensitizer, a photopolymerization assistant and a comonomer were added thereto to prepare a photosensitive polyimide precursor composition. A film was formed from this composition in the same manner as described in Example 1, and the resolution, sensitivity, development time, elongation of the film, and adhesive properties of the film were investigated. The results obtained are shown in

TABLE 8

| Example | Repeating unit (mol %) |
|---|---|

11, 12

—CO—R—CONH—[benzene-CO₂H]—NH—
(CO₂CH₂CH₂OCOC=CH₂)₂
       |
       CH₃

(25)

—CO—R—CONH—[benzene]—O—[benzene]—N—H
(CO₂CH₂CH₂OCOC=CH₂)₂
       |
       CH₃

(25)

—CO—R—CONH—[benzene-CO₂H]—NH—
(CO₂CH₂CH₃)₂

(25)

—CO—R—CONH—[benzene]—O—[benzene]—N—H
(CO₂CH₂CH₃)₂

(25)

As R in the structural formulas shown in Table 8, two kinds of groups represented by the following formulas (22), respectively, are present in a molar ratio of 1:1 in the polyimide precursor of Example 11, and two kinds of groups represented by the following formulas (23), respectively, are present in a molar ratio of 1:1 in the polyimide precursor of Table 9. The film formation conditions, evaluation conditions and criterions for evaluation were the same as those described in Examples 3 to 10. Also in Table 9, the amount of each additive added per 100 parts by weight of the photosensitive polyimide precursor is shown in the parentheses as in Table 5 and Table 6.

TABLE 9

Evaluation of characteristics of photosensitive polyimide precursors

| Example | Photosensitizer (parts by weight) | Photopolymerization assistant (parts by weight) | Comonomer (parts by weight) | Resolution | Sensitivity | Development time | Elongation | Adhesive properties |
|---|---|---|---|---|---|---|---|---|
| 11 | 2,4-Diethylthioxanthone (1) | 1,3-Diphenyl-1,2,3-propane-trione-2-(o-ethoxy-carbonyl)oxime (3) | Tetraethylene glycol diacrylate (8) | Good | Good | Good | Good | Good |
| 12 | 2,4-Dimethylthioxanthone (2) | 1,3-Diphenyl-1,2,3-propane-trione-2-(o-ethoxy-carbonyl)oxime (3) | Tetraethylene glycol diacrylate (8) | Good | Good | Good | Good | Good |

EXAMPLES 13 to 27

Acid chlorides of tetracarboxylic acid diesters were synthesized in the same manner as described in Example 1 except for using the acid dianhydride and one or two OH components and/or alcohols listed in Tables 10 to 12. Polyimide precursors comprising the repeating units shown in Table 13 were synthesized by reacting each acid chloride with the diamines listed in Tables 10 to 12 under the same reaction conditions as described in Example 1. The weight-average molecular weights of the obtained polyimide precursors were 10,000 to 40,000.

TABLE 10

Compositions of photosensitive polyimide precursors

| Example | Acid dianhydride (molar ratio) | Diamine (molar ratio) | OH component (molar ratio) |
|---|---|---|---|
| 13 | 3,3',4,4'-Biphenyl-tetracarboxylic dianhydride (100) | 3,5-Diaminobenzoic acid (70) 4,4'-Diamino-diphenyl ether (30) | 2-Hydroxyethyl methacrylate (100) Methanol (100) |
| 14 | 3,3',4,4'-Biphenyl-tetracarboxylic dianhydride (100) | 3,5-Diaminobenzoic acid (70) 4,4'-Diamino-diphenyl ether (30) | 2-Hydroxyethyl methacrylate (140) n-Butanol (60) |
| 15 | 3,3',4,4'-Biphenyl-tetracarboxylic dianhydride (100) | 4,4'-Diamino-diphenylether-2-carboxylic acid (70) 4,4'-Diamino-diphenyl ether (30) | 2-Hydroxyethyl methacrylate (200) |
| 16 | 3,3',4,4'-Biphenyl-tetracarboxylic dianhydride (100) | 4,4'-Diamino-diphenylmethane-3,3'-dicarboxylic acid (70) 4,4'-Diamino-diphenyl ether (30) | 2-Hydroxyethyl methacrylate (200) |
| 17 | 3,3',4,4'-Biphenyl-tetracarboxylic dianhydride (100) | 3,5-Diaminobenzoic acid (70) 4,4'-Diamino-diphenyl ether (30) | 2-Hydroxyethyl methacrylate (200) |

TABLE 11

Compositions of photosensitive polyimide precursors

| Example | Acid dianhydride (molar ratio) | Diamine (molar ratio) | OH component (molar ratio) |
|---|---|---|---|
| 18 | 4,4'-Oxydiphthalic dianhydride (100) | 3,5-Diaminobenzoic acid (70) 4,4'-Diamino-diphenyl ether (30) | 2-Hydroxyethyl methacrylate (100) Methanol (100) |
| 19 | 4,4'-oxydiphthalic dianhydride (100) | 3,5-Diaminobenzoic acid (70) 4,4'-Diamino-diphenyl ether (30) | 2-Hydroxyethyl methacrylate (140) n-Butanol (60) |
| 20 | 4,4'-Oxydiphthalic dianhydride (100) | 4,4'-Diamino-diphenylether-2-carboxylic acid (70) 4,4'-Diamino-diphenyl ether (30) | 2-Hydroxyethyl methacrylate (200) |
| 21 | 4,4'-oxydiphthalic dianhydride (100) | 4,4'-Diamino-diphenylmethane-3,3'-dicarboxylic acid (70) 4,4'-Diamino-diphenyl ether (30) | 2-Hydroxyethyl methacrylate (200) |
| 22 | 4,4'-Oxydiphthalic dianhydride (100) | 3,5-Diaminobenzoic acid (70) 4,4'-Diamino-diphenyl ether (30) | 2-Hydroxyethyl methacrylate (200) |

TABLE 12

Compositions of photosensitive polyimide precursors

| Example | Acid dianhydride (molar ratio) | Diamine (molar ratio) | OH component (molar ratio) |
|---|---|---|---|
| 23 | 3,3'-4,4'-Diphenylsulfone-tetracarboxylic dianhydride (100) | 3,5-Diaminobenzoic acid (70) 4,4'-Diaminodiphenyl ether (30) | 2-Hydroxyethyl methacrylate (100) Methanol (100) |
| 24 | 3,3'-4,4'-Diphenylsulfone-tetracarboxylic dianhydride (100) | 3,5-Diaminobenzoic acid (70) 4,4'-Diaminodiphenyl ether (30) | 2-Hydroxyethyl methacrylate (140) n-Butanol (60) |
| 25 | 3,3'-4,4'-Diphenylsulfone-tetracarboxylic dianhydride (100) | 4,4'-Diaminodiphenylether-2-carboxylic acid (70) 4,4'-Diaminodiphenyl ether (30) | 2-Hydroxyethyl methacrylate (200) |
| 26 | 3,3'-4,4'-Diphenylsulfone-tetracarboxylic dianhydride (100) | 4,4'-Diaminodiphenylmethane-3,3'-dicarboxylic acid (70) 4,4'-Diaminodiphenyl ether (30) | 2-Hydroxyethyl methacrylate (200) |
| 27 | 3,3'-4,4'-Diphenylsulfone-tetracarboxylic dianhydride (100) | 3,5-Diaminobenzoic acid (70) 4,4'-Diaminodiphenyl ether (30) | 2-Hydroxyethyl methacrylate (200) |

TABLE 13

| Example | Repeating unit (molar ratio %) |
|---|---|
| 13, 18, 23 | 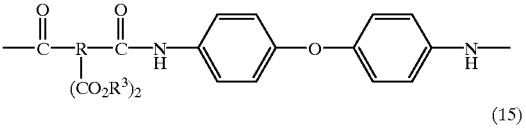 (35)    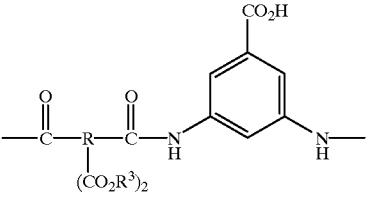 (15) |
|  | 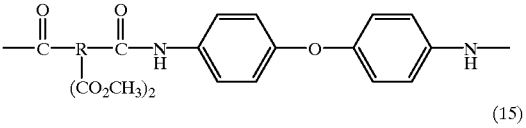 (35)    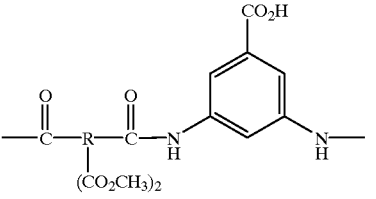 (15) |
| 14, 19, 24 | 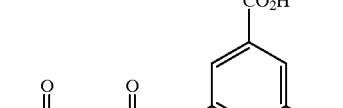 (49)    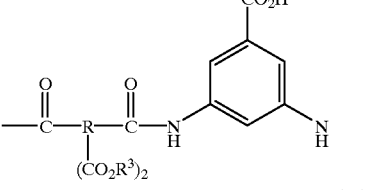 (21) |
|  | 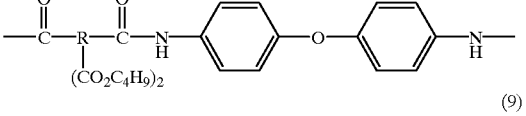 (21)    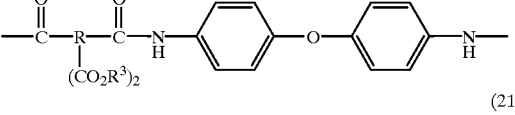 (9) |

TABLE 13-continued

| Example | Repeating unit (molar ratio %) |
|---|---|
| 15, 20, 25 | 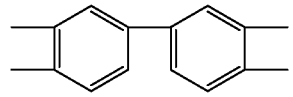 (70)     (30) |
| 16, 21, 26 | 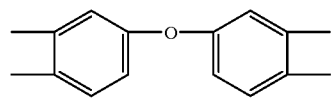 (70)     (30) |
| 17, 22, 27 | 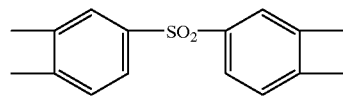 (70)     (30) |

In the structural formulas shown in Table 13, R is a group represented by the following formula (28) in Examples 13 to 17, a group represented by the following formula (29) in Examples 18 to 22, or a group represented by the following formula (30) in Examples 23 to 27:

(28)

(29)

(30)

In the structural formulas shown in Table 13, $R^3$ is a group represented by the following formula (31) in Examples 13 to 16, 18 to 21 and 22 to 27, or a group represented by the following formula (32) in Examples 17, 22 and 27:

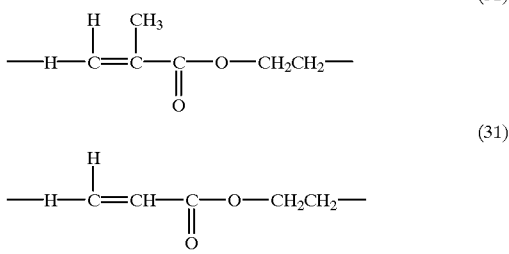

(31)

(31)

In the same manner as in Example 1, each of the obtained polyimide precursors was dissolved in a solvent, and a photosensitizer, a photopolymerization assistant and a comonomer were added thereto to prepare a photosensitive polyimide precursor composition. A film was formed from this composition in the same manner as described in Example 1, and the resolution, sensitivity, development time, elongation of the film, and adhesive properties of the film were investigated. The results obtained are shown in Tables 14 to 16. The film formation conditions, evaluation conditions and criterions for evaluation were the same as those described in Examples 3 to 10. In the Tables, the numbers in the parentheses denote the amount of each Iadditive added per 100 parts by weight of the photosensitive polyimide precursor.

TABLE 14

Evaluation of characteristics of photosensitive polyimide precursor compositions

| Example | Photosensitizer (parts by weight) | Photopolymerization assistant (parts by weight) | Comonomer (parts by weight) | Characteristics | | | | |
|---|---|---|---|---|---|---|---|---|
| | | | | Resolution | Sensitivity | Development time | Elongation | Adhesive properties |
| 13 | Michler's ketone (2) | N-phenylglycine (2) | Tetraethylene glycol diacrylate (10) | Good | Good | Good | Good | Good |
| 14 | 7-Diethyl-amino-4-methyl-coumarin (2) | 3,3',4,4'-Tetra-(t-butylperoxy-carbonyl)benzo-phenone (2) | Tetraethylene glycol diacrylate (10) | Good | Good | Good | Good | Good |
| 15 | Benzanthrone (0.5) | 4-Diethylamino-ethyl benzoate (1) | Tetraethylene glycol diacrylate (10) | Good | Good | Good | Good | Good |
| 16 | 7-Diethyl-amino-4-methyl-coumarin (1) | 1,3-Diphenyl-1,2,3-propanetrione-2-(o-ethoxycarbonyl)-oxime (3) | Tetraethylene glycol diacrylate (10) | Good | Good | Good | Good | Good |
| 17 | 7-Diethyl-amino-4-methyl-coumarin (3) | 1,3-Diphenyl-1,2,3-propanetrione-2-(o-ethoxycarbonyl)-oxime (3) | Tetraethylene glycol diacrylate (10) | Good | Good | Good | Good | Good |

TABLE 15

Evaluation of characteristics of photosensitive polyimide precursor compositions

| Example | Photosensitizer (parts by weight) | Photopolymerization assistant (parts by weight) | Comonomer (parts by weight) | Characteristics | | | | |
|---|---|---|---|---|---|---|---|---|
| | | | | Resolution | Sensitivity | Development time | Elongation | Adhesive properties |
| 18 | Michler's ketone (2) | N-phenylglycine (2) | Tetraethylene glycol diacrylate (10) | Good | Good | Good | Good | Good |
| 19 | 7-Diethyl-amino-4-methyl-coumarin (2) | 3,3',4,4'-Tetra-(t-butylperoxy-carbonyl)benzo-phenone (2) | Tetraethylene glycol diacrylate (10) | Good | Good | Good | Good | Good |
| 20 | Benzanthrone (0.5) | 4-Diethylamino-ethyl benzoate (1) | Tetraethylene glycol diacrylate (10) | Good | Good | Good | Good | Good |
| 21 | 7-Diethyl-amino-4-methyl-coumarin (1) | 1,3-Diphenyl-1,2,3-propanetrione-2-(o-ethoxycarbonyl)-oxime (3) | Tetraethylene glycol diacrylate (10) | Good | Good | Good | Good | Good |
| 22 | 7-Diethyl-amino-4-methyl-coumarin (3) | 1,3-Diphenyl-1,2,3-propanetrione-2-(o-ethoxycarbonyl)-oxime (3) | Tetraethylene glycol diacrylate (10) | Good | Good | Good | Good | Good |

TABLE 16

Evaluation of characteristics of photosensitive polyimide precursor compositions

| Example | Photosensitizer (parts by weight) | Photopolymerization assistant (parts by weight) | Comonomer (parts by weight) | Resolution | Sensitivity | Development time | Elongation | Adhesive properties |
|---|---|---|---|---|---|---|---|---|
| 23 | Michler's ketone (2) | N-phenylglycine (2) | Tetraethylene diacrylate (10) | Good | Good | Good | Good | Good |
| 24 | 7-Diethylamino-4-methylcoumarin (2) | 3,3',4,4'-Tetra-(t-butylperoxycarbonyl)benzophenone (2) | Tetraethylene glycol diacrylate (10) | Good | Good | Good | Good | Good |
| 25 | Benzanthrone (0.5) | 4-Diethylaminoethyl benzoate (1) | Tetraethylene glycol diacrylate (10) | Good | Good | Good | Good | Good |
| 26 | 7-Diethylamino-4-methylcoumarin (1) | 1,3-Diphenyl-1,2,3-propanetrione-2-(o-ethoxycarbonyl)-oxime (3) | Tetraethylene glycol diacrylate (10) | Good | Good | Good | Good | Good |
| 27 | 7-Diethylamino-4-methylcoumarin (3) | 1,3-Diphenyl-1,2,3-propanetrione-2-(o-ethoxycarbonyl)-oxime (3) | Tetraethylene glycol diacrylate (10) | Good | Good | Good | Good | Good |

EXAMPLE 28

A. Synthesis of a Poly(amic acid) Ester

A poly(amic acid) ester comprising the same repeating units of the following formula (16) as those of the poly(amic acid) ester synthesized in Example 1 was synthesized in the same manner as described in Example 1:

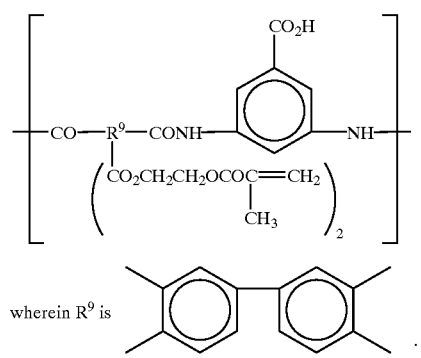

(16)

wherein $R^9$ is

B. Synthesis of a Siloxane-containing Poly(amic acid)

In a 100-ml four-necked flask were placed 10.00 g (0.0234 mol) of 1,3-bis(3,4-dicarboxyphenylic anhydride)-1,1,3,3-tetramethyldisiloxane (SXDA) and 29 ml of NMP, and 5.82 g (0.0234 mol) of 1,3-bis(3-aminopropyl) tetramethyldisiloxane was added with stirring at 25° C. When the stirring was continued, a transparent solution was obtained in 2 hours. This solution was diluted with 50 ml of NMP and the dilution was poured into 1 liter of water, after which the polymer precipitated was collected by filtration, washed twice with water and then dried in vacuo to obtain 13 g of a poly(amic acid) comprising repeating units of the formula (33) shown below. The weight-average molecular weight of the poly(amic acid) was measured by GPC and found to be 20,000 in terms of polystyrene.

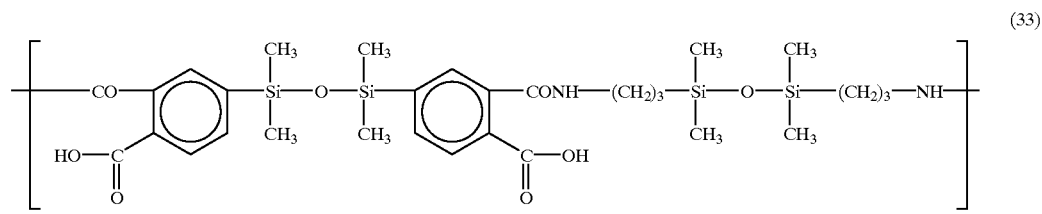

(33)

C. Preparation of a Polyimide Precursor Composition

In 15.0 g of γ-butyrolactone were dissolved 9 g of the poly(amic acid) ester obtained in step A and 1 g of the poly(amic acid) obtained in step B, and then 100 mg of 3,5-bis(4-diethylaminobenzylidene)-1-methyl-4-azacyclohexanone and 200 mg of 4-diethylaminoethyl benzoate. The resulting solution was filtered through a filter with a pore size of 5 μm under pressure to obtain a photosensitive polyimide precursor composition in the form of a solution.

D. Evaluation of the Viscosity Stability of Varnish

The obtained photosensitive polyimide precursor composition solution (varnish) was placed in a brown bottle and its viscosity was measured at 25° C. and found to be 4.50 mPa·s. When the varnish was then stored at room temperature for 1 week, the varnish was not gelatinized and its viscosity at 25° C. was 4.60 mPa·s, namely, it was stable without a significant change.

E. Evaluation of a Polyimide Film

Using the obtained solution (varnish), a polyimide film of 10 μm thick was formed on a silicon wafer in the same manner as in Example 1. When the adhesive properties of the polyimide film was measured by pressure-sensitive adhesive tape test (JIS D-0202), Adno peeling was observed. In addition, when the silicon wafer having the polyimide film formed thereon was subjected to PCT treatment (125° C., 2.3 atmospheres) for 500 hours and the adhesive properties were measured again, no peeling was observed at all. On the other hand, the polyimide film was peeled from the silcon wafer and the elongation of the film was measured and found to be as good as 9%. The dependence of the film thickness after development on exposure dose was measured to find that the sensitivity was 80 mJ/cm2 when the sensitivity was defined as an exposure dose at which the film thickness after development became one-half of the coating thickness.

When a polyimide film of 2 to 3 μm thick was formed in the same manner as above and its infrared absorption spectrum was measured, there were observed an absorption due to imide group at 1780 cm−1 and an absorption due to carboxyl group at 2800 to 3600 cm−1.

F. Formation of a Resin Pattern

The polyimide precursor composition prepared in step C was coated, exposed to light, developed and then rinsed in the same manner as described in step E, except that in the exposure, the coating film was closely covered with a photomask patterned with stripes of 10 μm wide. Thus, there was obtained a relief pattern of 10 μm wide made of semi-cured polyimide precursor and having sharp edge faces. This pattern was heat-treated in the same manner as in the above-mentioned polyimide film formation to obtain a resin pattern made of polyimide, with high precision.

EXAMPLE 29

A. Synthesis of a Poly(amic acid) Ester

In the same manner as in Example 2, 20 g of a poly(amic acid) ester comprising the same repeating units of the following formula (18) as those of the poly(amic acid) ester synthesized in Example 2 was obtained. The weight-average molecular weight of this polymer was measured by GPC and found to be 39,000 in terms of polystyrene.

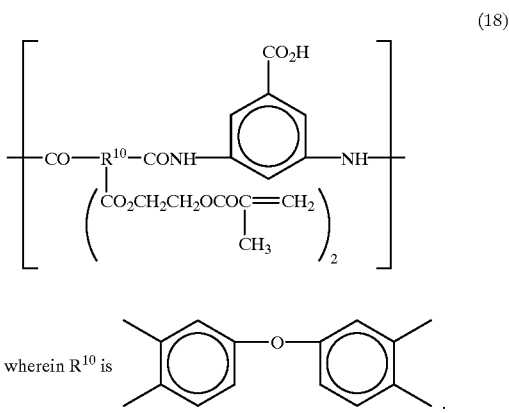

B. Synthesis of a Siloxane-containing Poly(amic acid)

In a 100-ml four-necked flask were placed 10.00 g (0.0234 mol) of SXDA and 29 ml of NMP, and 8.85 g (0.0234 mol) of 1,3-bis(m-aminophenoxymethyl) tetramethyldisiloxane was added with stirring at 25° C. When the stirring was continued, a transparent solution was obtained in 2 hours. This solution was diluted with 50 ml of NMP and the dilution was poured into 1 liter of water, after which the polymer precipitated was collected by filtration, washed twice with water and then dried in vacuo to obtain 13 g of a poly(amic acid) comprising repeating units of the formula (34) shown below. The weight-average molecular weight of the poly(amic acid) was measured by GPC and found to be 20,000 in terms of polystyrene.

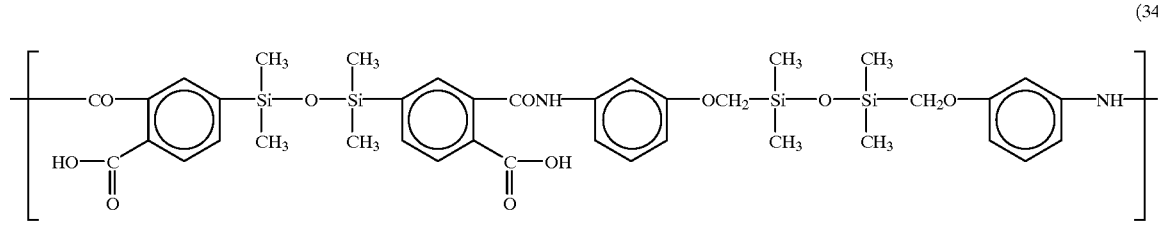

C. Preparation of a Polyimide Precursor Composition

In 15.0 g of γ-butyrolactone were dissolved 9 g of the poly(amic acid) ester obtained in step A and 1 g of the siloxane-containing poly(amic acid) obtained in step B, and then 100 mg of Michler's ketone and 200 mg of 1,3-diphenyl-1,2,3-propanetrione-2-(o-ethoxy-carbonyl)oxime. The resulting solution was filtered through a filter with a pore size of 5 μm under pressure to obtain a photosensitive polyimide precursor composition in the form of a solution.

D. Evaluation of the Viscosity Stability of Varnish

The obtained photosensitive polyimide precursor composition solution (varnish) was placed in a brown bottle and its viscosity was measured at 25° C. and found to be 4.10 mPa·s. When the varnish was then stored at room temperature for 1 week, the varnish was not gelatinized and its viscosity at 25° C. was 4.20 mPa·s, namely, it was stable without a significant change.

E. Evaluation of a Polyimide Film

Using the obtained solution (varnish), a polyimide film of 10 μm thick was formed on a silicon wafer in the same manner as in Example 1. When the polyimide film was evaluated in the same manner as described in Example 28, it exhibited the same high adhesive properties as those attained in Example 28, and a better elongation of 10%. The sensitivity was 90 mJ/cm$^2$.

When a polyimide film of 2 to 3 μm thick was formed in the same manner as above and its infrared An absorption spectrum was measured, there were observed an absorption due to imide group at 1785 cm$^{-1}$ and an absorption due to carboxyl group at 2800 to 3600 cm$^{-1}$.

F. Formation of a Resin Pattern

The polyimide precursor composition prepared in step C was coated, exposed, developed and then rinsed in the same manner as described in step E, except that in the exposure to light, the coating film was closely covered with a photomask patterned with stripes of 10 μm wide. Thus, there was obtained a relief pattern of 10 μm wide made of semi-cured polyimide precursor and having sharp edge faces. This pattern was heat-treated in the same manner as in the above-mentioned polyimide film formation to obtain a resin pattern made of polyimide, with high precision.

EXAMPLES 30 to 39

Acid chlorides of tetracarboxylic acid diesters were synthesized in the same manner as described in Example 1, step A except for using the acid dianhydride and one or two OH components listed in Table 17 and Table 18. Poly(amic acid) esters were synthesized by reacting each acid chloride with the one or two diamines listed in Tables 17 and 18. The weight-average molecular weights of the obtained poly (amic acid) esters were 20,000 to 40,000.

TABLE 17

Compositions of photosensitive polyimide precursors

| Example | Acid dianhydride (molar ratio) | Diamine (molar ratio) | OH component (molar ratio) |
|---|---|---|---|
| 30 | 3,3'-4,4'-Biphenyltetra-carboxylic dianhydride (100) | 3,5-Diaminobenzoic acid (50) 4,4'-Diamino-diphenyl ether (50) | 2-Hydroxy-ethyl methacrylate (200) |
| 31 | 3,3'-4,4'-Biphenyltetra-carboxylic dianhydride (100) | 3,5-Diaminobenzoic acid (70) 4,4'-Diamino-diphenyl ether (30) | 2-Hydroxy-ethyl methacrylate (240) |
| 32 | 3,3'-4,4'-Biphenyltetra-carboxylic dianhydride (100) | 3,5-Diaminobenzoic acid (50) 4,4'-Diamino-diphenyl ether (50) | 2-Hydroxy-ethyl methacrylate (100) n-Butanol (100) |
| 33 | 3,3'-4,4'-Biphenyltetra-carboxylic dianhydride (100) | 3,5-Diaminobenzoic acid (70) 4,4'-Diamino-diphenyl ether (30) | 2-Hydroxy-ethyl methacrylate (100) n-Butanol (100) |

TABLE 17-continued

Compositions of photosensitive polyimide precursors

| Example | Acid dianhydride (molar ratio) | Diamine (molar ratio) | OH component (molar ratio) |
|---|---|---|---|
| 34 | 3,3'-4,4'-Biphenyltetra-carboxylic dianhydride (100) | 4,4'-Diamino-3,3'-dihydroxybiphenyl (100) | 2-Hydroxy-ethyl methacrylate (200) |

TABLE 18

Compositions of photosensitive polyimide precursors

| Example | Acid dianhydride (molar ratio) | Diamine (molar ratio) | OH component (molar ratio) |
|---|---|---|---|
| 35 | 4,4'-Oxydi-phthalic dianhydride (100) | 3,5-Diaminobenzoic acid (50) 4,4'-Diamino-diphenyl ether (50) | 2-Hydroxy-ethyl methacrylate (200) |
| 36 | 4,4'-Oxydi-phthalic dianhydride (100) | 3,5-Diaminobenzoic acid (70) 4,4'-Diamino-diphenyl ether (30) | 2-Hydroxy-ethyl methacrylate (200) |
| 37 | 4,4'-Oxydi-phthalic dianhydride (100) | 3,5-Diaminobenzoic acid (50) 4,4'-Diamino-diphenyl ether (50) | 2-Hydroxy-ethyl methacrylate (100) n-Butanol (100) |
| 38 | 4,4'-Oxydi-phthalic dianhydride (100) | 3,5-Diaminobenzoic acid (70) 4,4'-Diamino-diphenyl ether (30) | 2-Hydroxy-ethyl methacrylate (100) n-Butanol (100) |
| 39 | 4,4'-Oxydi-phthalic dianhydride (100) | 4,4'-Diamino-3,3'-dihydroxybiphenyl (100) | 2-Hydroxy-ethyl methacrylate (200) |

Siloxane-containing poly(amic acid)s comprising the repeating units shown in Table 21 were synthesized in the same manner as described in Example 28, step B except for using the one or two acid dianhydrides and one or two diamines listed in Table 19 and Table 20. The weight-average molecular weights of the obtained poly(amic acid)s were 10,000 to 40,000.

TABLE 19

Compositions of poly(amic acid)s

| Example | Acid dianhydride (molar ratio) | Diamine (molar ratio) |
|---|---|---|
| 30, 35 | 1,3-Bis(3,4-dicarboxy-phenylic anhydride)-1,1,3,3-tetramethyl-disiloxane (100) | 1,3-Bis(3-aminopropyl)-tetramethyldisiloxane (100) |

TABLE 19-continued

Compositions of poly(amic acid)s

| Example | Acid dianhydride (molar ratio) | Diamine (molar ratio) |
|---|---|---|
| 31 | 1,3-Bis(3,4-dicarboxy-phenylic anhydride)-1,1,3,3-tetramethyl-disiloxane (50)<br>3,3',4,4'-Biphenyltetra-carboxylic dianhydride (50) | 1,3-Bis(3-aminopropyl)-tetramethyldisiloxane (100) |
| 32 | 1,3-Bis(3,4-dicarboxy-phenylic anhydride)-1,1,3,3-tetramethyl-disiloxane (50)<br>3,3',4,4'-Biphenyltetra-carboxylic dianhydride (50) | 1,3-Bis(3-aminopropyl)-tetramethyldisiloxane (100)<br>4,4'-Diaminodiphenyl ether (50) |
| 33, 38 | 1,3-Bis(3,4-dicarboxy-phenylic anhydride)-1,1,3,3-tetramethyl-disiloxane (100) | 4,4'-Diaminodiphenyl ether (100) |
| 34 | 3,3',4,4'-Biphenyltetra-carboxylic dianhydride (100) | 1,3-Bis(3-aminophenoxy-methyl)tetramethyl-disiloxane (100) |

TABLE 20

Compositions of poly(amic acid)s

| Example | Acid dianhydride (molar ratio) | Diamine (molar ratio) |
|---|---|---|
| 36 | 1,3-Bis(3,4-dicarboxy-phenylic anhydride)-1,1,3,3-tetramethyl-disiloxane (50)<br>4,4'-Oxydiphthalic dianhydride (50) | 1,3-Bis(3-aminopropyl)-tetramethyldisiloxane (100) |
| 37 | 1,3-Bis(3,4-dicarboxy-phenylic anhydride)-1,1,3,3-tetramethyl-disiloxane (50)<br>4,4'-Oxydiphthalic dianhydride (50) | 1,3-Bis(3-aminopropyl)-tetramethyldisiloxane (50)<br>4,4'-Diaminodiphenyl ether (50) |
| 39 | 4,4'-Oxydiphthalic dianhydride (100) | 1,3-Bis(3-aminopropyl)-tetramethyldisiloxane (100) |

TABLE 21

| Example | Repeating unit (molar ratio %) |
|---|---|
| 30, 35 | —CO—$R^{14}$(—$(CO_2H)_2$)—CONH—$R^{15}$—NH— (100) |
| 31 | —CO—$R^{14}$(—$(CO_2H)_2$)—CONH—$R^{15}$—NH— (50)   —CO—$R^{16}$(—$(CO_2H)_2$)—CONH—$R^{15}$—NH— (50) |
| 32 | —CO—$R^{14}$(—$(CO_2H)_2$)—CONH—$R^{15}$—NH— (25)   —CO—$R^{16}$(—$(CO_2H)_2$)—CONH—$R^{15}$—NH— (25)<br>—CO—$R^{14}$(—$(CO_2H)_2$)—CONH—⟨C₆H₄⟩—O—⟨C₆H₄⟩—NH— (25)   —CO—$R^{16}$(—$(CO_2H)_2$)—CONH—⟨C₆H₄⟩—O—⟨C₆H₄⟩—NH— (25) |
| 33, 38 | —CO—$R^{14}$(—$(CO_2H)_2$)—CONH—⟨C₆H₄⟩—O—⟨C₆H₄⟩—NH— (100) |

TABLE 21-continued

| Example | Repeating unit (molar ratio %) | |
|---|---|---|
| 34 | —CO—R$^{16}$(—(CO$_2$H)$_2$)—CONH—R$^{15}$—NH— (100) | |
| 36 | —CO—R$^{14}$(—(CO$_2$H)$_2$)—CONH—R$^{15}$—NH— (50) | —CO—R$^{17}$(—(CO$_2$H)$_2$)—CONH—R$^{15}$—NH— (50) |
| 37 | —CO—R$^{14}$(—(CO$_2$H)$_2$)—CONH—R$^{15}$—NH— (25) | —CO—R$^{17}$(—(CO$_2$H)$_2$)—CONH—R$^{15}$—NH— (25) |
| 39 | —CO—R$^{17}$(—(CO$_2$H)$_2$)—CONH—R$^{15}$—NH— (100) | |

The numbers in the patentheses in Table 21 denote the percentage (mol %) of each kind of repeating units based on the total number of moles of repeating units in a molecule of the poly(amic acid). In Table 21, R$^{14}$ through R$^{17}$ represent the following structures:

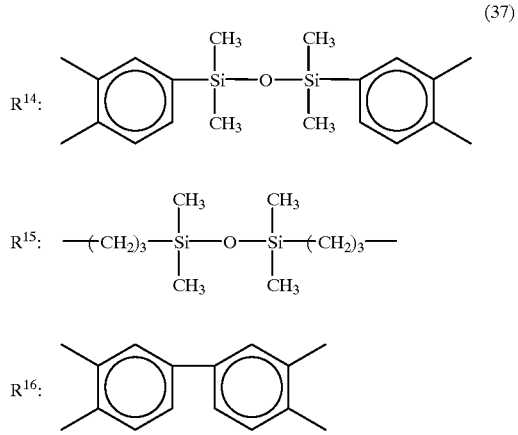

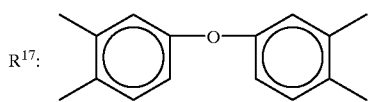

In the same manner as in Example 28, each of the obtained poly(amic acid) esters and each of the obtained siloxane-containing poly(amic acid)s were dissolved in a solvent, and a photosensitizer, a photopolymerization assistant and a comonomer were added thereto to prepare a photosensitive polyimide precursor composition. The stability of the thus obtained compositions was evaluated in the same manner as described in Example 28 to find that all the compositions were good in stability like the composition obtained in Example 28. A film was formed from each composition in the same manner as described in Example 28 and the resolution, sensitivity, development time, and elongation of the film were investigated. Table 22 and Table 23 show the additives used in each Example and characteristics of the film obtained in the Example. The amount of each additive added is expressed in parts by weight in the parentheses.

TABLE 22

Evaluation of characteristics of photosensitive polyimide precursor compositions

| Example | Poly(amic acid) ester (parts by weight) | Siloxane-containing poly(amic acid) (parts by weight) | Photosensitizer (parts by weight) | Photopolymerization assistant (parts by weight) | Comonomer (parts by weight) | Characteristics | | | | |
|---|---|---|---|---|---|---|---|---|---|---|
| | | | | | | Resolution | Sensitivity | Development time | Elongation | Adhesive properties |
| 30 | (10) | (90) | Michler's ketone | N-phenylglycine | None | Good | Good | Good | Good | Good |

TABLE 22-continued

Evaluation of characteristics of photosensitive polyimide precursor compositions

| Example | Poly-(amic acid) ester (parts by weight) | Siloxane-containing poly-(amic acid) (parts by weight) | Photo-sensitizer (parts by weight) | Photo-polymerization assistant (parts by weight) | Comonomer (parts by weight) | Resolution | Sensitivity | Development time | Elongation | Adhesive properties |
|---|---|---|---|---|---|---|---|---|---|---|
| 31 | (5) | (95) | 7-Diethyl-amino-4-methyl-coumarin (2) | 3,3',4,4' Tetra(t-butylperoxy-carbonyl)-benzophenone (2) | None | Good | Good | Good | Good | Good |
| 32 | (3) | (97) | Benzan-throne (05) | 4-Diethyl-aminoethyl benzoate (1) | None | Good | Good | Good | Good | Good |
| 33 | (10) | (90) | 7-Diethyl-amino-4-ethyl coumarin (1) | 1,3-Diphenyl-1,2,3-propane-trione-2-(o-ethoxy-carbonyl)oxime (3) | None | Good | Good | Good | Good | Good |
| 34 | (1) | (99) | 7-Diethyl-amino-4-methyl-coumarin (3) | 1,3-Diphenyl-1,2,3-propane-trione-2-(o-ethoxy-carbonyl)oxime (3) | Tetra-ethylene glycol di-acrylate (10) | Good | Good | Good | Good | Good |

TABLE 23

Evaluation of characteristics of photosensitive polyimide precursor compositions

| Example | Poly-(amic acid) ester (parts by weight) | Siloxane-containing poly-(amic acid) (parts by weight) | Photo-sensitizer (parts by weight) | Photo-polymerization assistant (parts by weight) | Comonomer (parts by weight) | Resolution | Sensitivity | Development time | Elongation | Adhesive properties |
|---|---|---|---|---|---|---|---|---|---|---|
| 35 | (10) | (90) | Michler's ketone (2) | N-phenyl-glycine (2) | None | Good | Good | Good | Good | Good |
| 36 | (5) | (95) | 7-Diethyl-amino-4-methyl-coumarin (2) | 3,3',4,4' Tetra(t-butylperoxy-carbonyl)-benzophenone (2) | None | Good | Good | Good | Good | Good |
| 37 | (3) | (97) | Benzan-throne (0.5) | 4-Diethyl-aminoethyl benzoate (1) | None | Good | Good | Good | Good | Good |
| 38 | (10) | (90) | 7-Diethyl-amino-4-methyl-coumarin (1) | 1,3-Diphenyl-1,2,3-propane-trione-2-(o-ethoxy-carbonyl)oxime (3) | None | Good | Good | Good | Good | Good |
| 39 | (1) | (99) | 7-Diethyl-amino-4-methyl-coumarin (1) | 1,3-Diphenyl-1,2,3-propane-trione-2-(o-ethoxy-carbonyl)oxime (3) | Tetra-ethylene glycol di-acrylate (10) | Good | Good | Good | Good | Good |

The film formation conditions and the evaluation conditions were the same as those described in Example 1, and the film thickness was adjusted to 10 to 20 $\mu$m. However, the adhesive properties were rated as good when no peeling was observed when pressure-sensitive adhesive tape test (JIS D-0202) was carried out after PCT treatment (125° C., 2.3 atmospheres) for 500 hours.

COMPARATIVE EXAMPLE 1

A photosensitive polyimide precursor was synthesized in the same manner as in Example 1 of JP-B 5-67026, and using this precursor, a photosensitive polyimide precursor composition was prepared in the same manner as described in Example 1 of the present specification. When a coating film was formed from the composition, exposed to light through a photomask, and then developed with the same developing solution as described in Example 1 of the present specification, no pattern could be formed because both the exposed portion and the non-exposed portion were not soluble in the developing solution at all. Therefore, a pattern was obtained by carrying out development with the organic solvent (N-methylpyrrolidone) described in Example 1 of JP-B 5-67026, but the resolution was so poor that only through-holes of 30 $\mu$m or more could be resolved.

COMPARATIVE EXAMPLE 2

In the same manner as in Example of JP-B 63-31939, the poly(amic acid) listed as No. 1 in Table 1 of this reference was synthesized, and using this poly(amic acid), a photosensitive polyimide precursor composition was prepared in the same manner as described in Example 1 of the present specification. When a coating film was formed from the composition, exposed to light through a photomask, and then developed with the same developing solution as described in Example 1 of the present specification, no pattern could be formed because both the exposed portion and the non-exposed portion were dissolved in the developing solution.

Therefore, a coating film was formed in the same manner as above, exposed to light, developed with the developer composed of organic solvents (a mixed solvent consisting of 4 volumes of N-methyl-2-pyrrolidone and 1 volume of ethanol) described in Example 1 of JP-B 61–31939, and then rinsed with ethanol to obtain a pattern, but the resolution was so poor that only through-holes of 40 $\mu$m or more could be resolved.

COMPARATIVE EXAMPLE 3

A photosensitive polyimide precursor was synthesized in the same manner as in Example 1 of JP-A 6-258835, and using this precursor, a photosensitive polyimide precursor composition was prepared in the same manner as described in Example 1 of the present specification. When a film was formed from the composition, exposed, and then developed (the exposed portion were removed in the present comparative example) with the same developing solution as described in Example 1 of the present specification, the sensitivity was so low that no pattern of 10 $\mu$m thick could be formed unless the exposure dose was 1,000 mJ/cm2 or more. Moreover, the development time (the time of immersion in the developing solution) was 5 minutes or more.

As described above in detail, the polyimide precursor of the present invention is soluble in an alkaline aqueous solution. When the polyimide precursor is a photosensitive polyimide precursor having photosensitivity imparted by introduction of photosensitive groups, the polyimide precursor can be developed not with an organic solvent but with an alkaline aqueous solution. Therefore, when a resin pattern is formed using a photosensitive material or a photosensitive polyimide precursor composition, which contains the polyimide precursor of the present invention, various problems in the employment of an organic solvent, such as undesirable influences on the health of workers, etc. can be avoided. In addition, when the polyimide precursor of the present invention is used in a protective film (e.g. the surface coating film of a semiconductor device), the interlaminar insulating film of a thin-film multilayer circuit board, or the like, the swelling of exposed portion during development, labor required for treating a waste fluid, etc. can be reduced.

Furthermore, of the polyimide precursors of the present invention, photosensitive polyimide precursors having photosensitivity imparted by introduction of photosensitive groups are highly sensitive and require only a short development time, so that a process for forming a resist pattern using a photosensitive material or a photosensitive polyimide precursor composition, which contains the photosensitive polyimide precursor is satisfactorily suitable as a practical production process.

What is claimed is:

1. A polyimide precursor having repeating units of the following formula (1) and a weight-average molecular weight of 10,000 to 200,000:

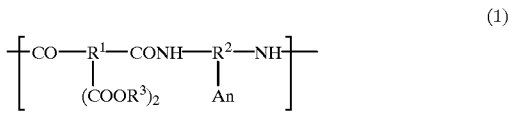

(1)

wherein $R^1$ is a tetravalent organic group having 4 or more carbon atoms; $R^2$ is a trivalent or tetravalent organic group containing one or more aromatic rings; $R^3$ is (a) a group represented by the formula:

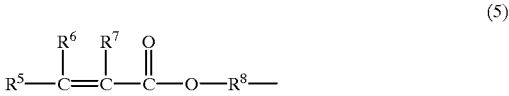

(5)

wherein $R^5$, $R^6$ and $R^7$ are independently a hydrogen atom, an alkyl group, a phenyl group, a vinyl group, or a propenyl group; and $R^8$ is a divalent organic group, or a combination of (a) and (b) an alkyl group having 1 to 6 carbon atoms; A is a monovalent group showing acidity; and n is an integer of 1 or 2.

2. A polyimide precursor according to claim 1, wherein A is at least one group selected from the group consisting of a sulfonic acid group, a sulfinic acid, a carboxylic acid group, and an hydroxyl group.

3. A polyimide precursor according to claim 2, wherein A is a carboxylic acid group.

4. A polyimide precursor according to claim 1, wherein $R^1$ is one member selected from the following formulae;

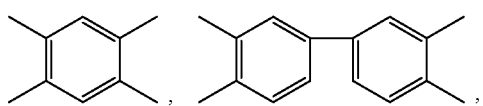

-continued
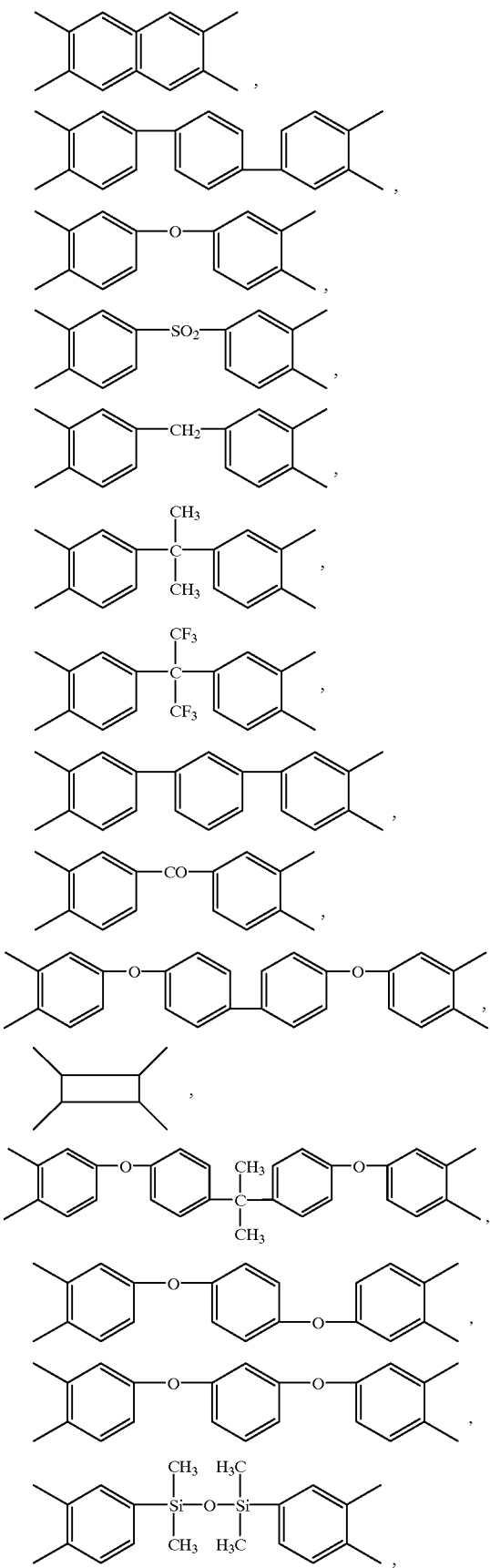
-continued
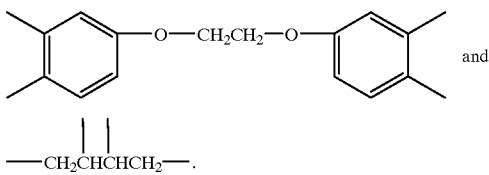
and
—CH₂CHCHCH₂—.
5. A polyimide precursor according to claim 1, wherein $R^2$ is one member selected from the following formulae:
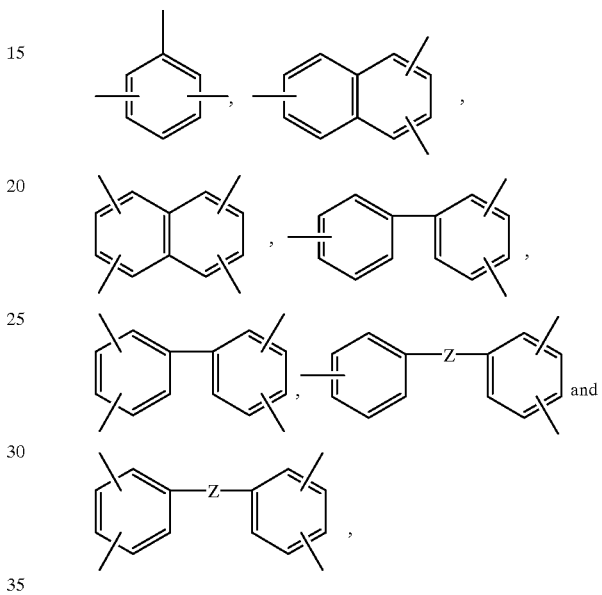
and Z is one member selected from the following formulae:
—O—, —S—, —CO—, —SO₂—, —CH₂—, —C(CF₃)₂—,
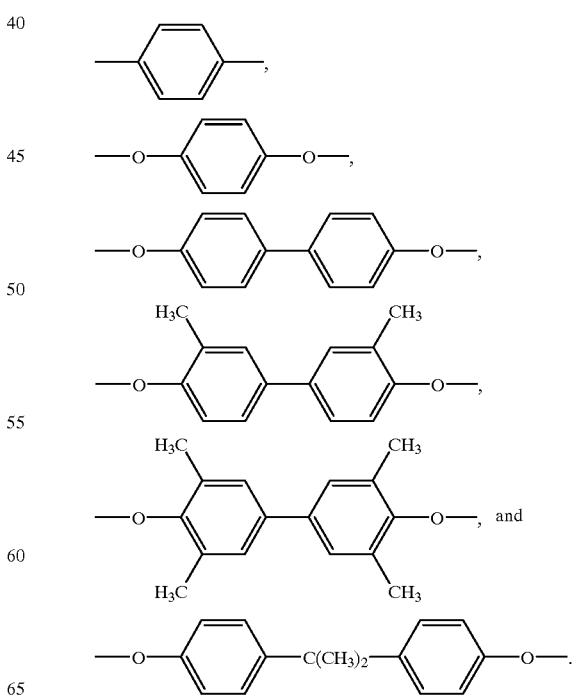

6. A polyimide precursor having repeating units of the following formulae (1) and (2) and a weight-average molecular weight of 10,000 to 200,000:

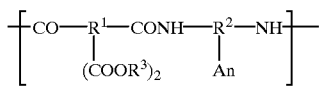 (1)

wherein $R^1$ is a tetravalent organic group having 4 or more carbon atoms; $R^2$ is a trivalent or tetravalent organic group containing one or more aromatic rings; $R^3$ is (a) a group represented by the formula:

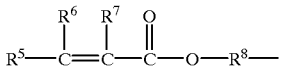 (5)

wherein $R^5$, $R^6$ and $R^7$ are independently a hydrogen atom, an alkyl group, a phenyl group, a vinyl group, or a propenyl group; and $R^8$ is a divalent organic group, or a combination of (a) and (b) an alkyl group having 1 to 6 carbon atoms; A is a monovalent group showing acidity; and n is an integer of 1 or 2; and

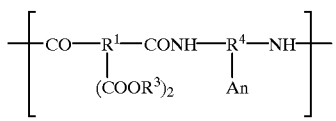 (2)

wherein $R^1$ is a tetravalent organic group having 4 or more carbon atoms; $R^3$ is a monovalent organic group; and $R^4$ is a divalent organic group containing one or more aromatic rings or silicon atoms; wherein the number of repeating units of the formula (1) is 10 or more and the number of repeating units of the formula (2) is 90 or less when a total of the repeating units of the formulae (1) and (2) is 100.

7. A polyimide precursor according to claim 6, wherein A is at least one group selected from the group consisting of a sulfonic acid group, a sulfinic acid, a carboxylic acid group, and a hydroxyl group.

8. A polyimide precursor according to claim 6, wherein $R^1$ is one member selected from the following formulae:

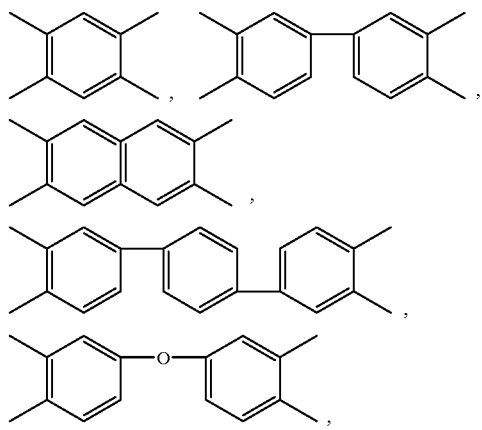

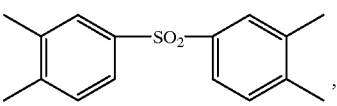

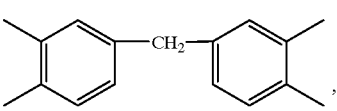

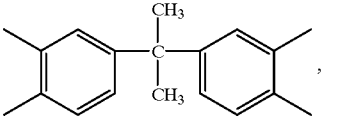

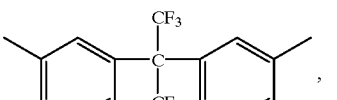

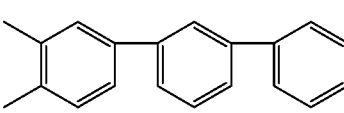

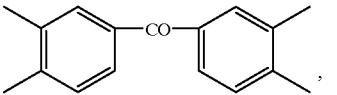

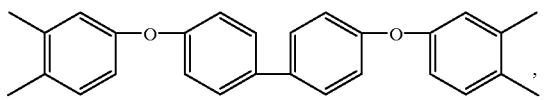

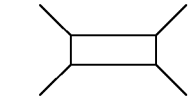

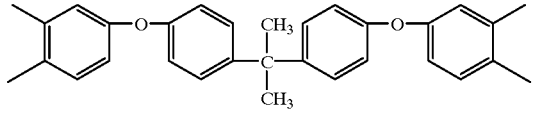

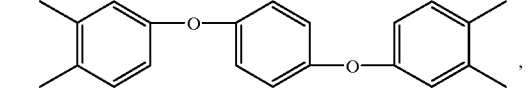

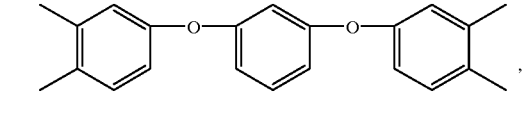

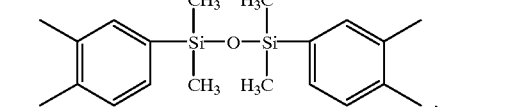 and

—CH₂CHCHCH₂—.

9. A polyimide precursor according to claim 6, wherein $R^2$ is one member selected from the following formulae:

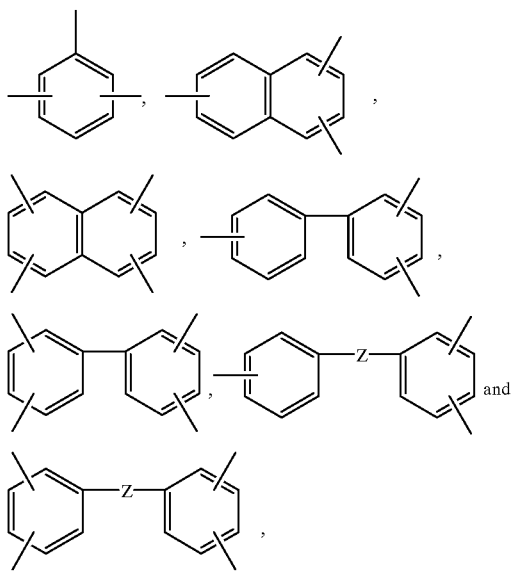

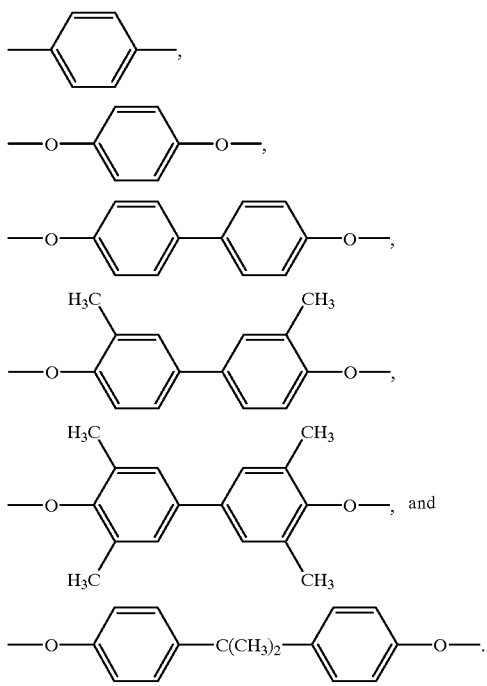

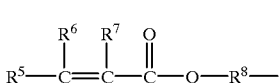

10. A polyimide precursor according to claim 6, wherein $R^3$ is represented by the formula:

$$R^5-\underset{\underset{\text{C}}{R^6}}{C}=\underset{\underset{\text{C}}{R^7}}{C}-\underset{\underset{\text{O}}{\parallel}}{C}-O-R^8- \quad (5)$$

wherein $R^5$, $R^6$ and $R^7$ are independently a hydrogen atom, an alkyl group, a phenyl group, a vinyl group, or a propenyl group; and R8 is a divalent organic group.

11. A polyimide precursor according to claim 10, wherein $R^3$ is represented by the formula:

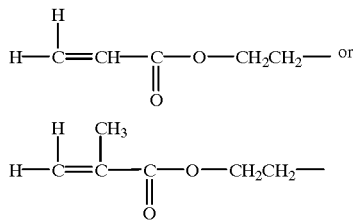

12. A polyimide precursor according to claim 6, wherein $R^3$ in one molecule is represented by the formula:

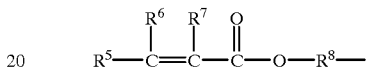

wherein $R^5$, $R^6$ and $R^7$ are independently a hydrogen atom, an alkyl group, a phenyl group, a vinyl group, or a propenyl group; and R8 is a divalent organic group, in an amount of 10 to 100% by mole, and the remainder is an alkyl group having 1 to 6 carbon atoms.

13. A polyimide precursor according to claim 6, wherein $R^4$ is one member selected from the following formulae:

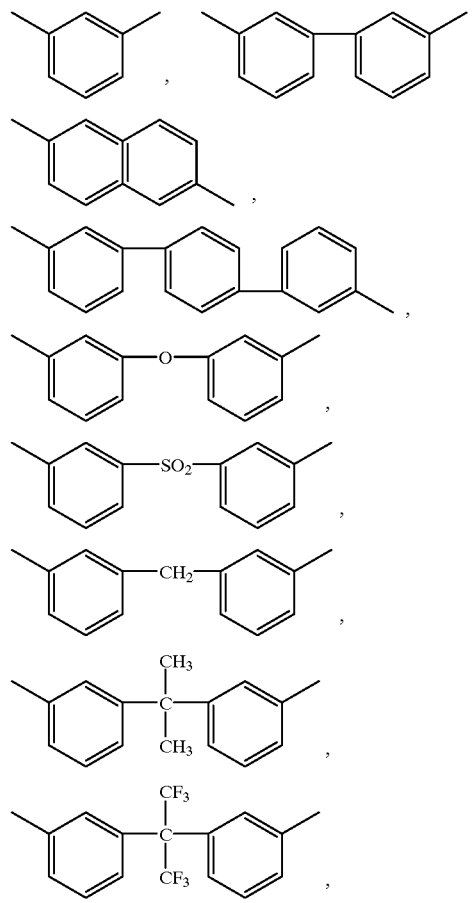

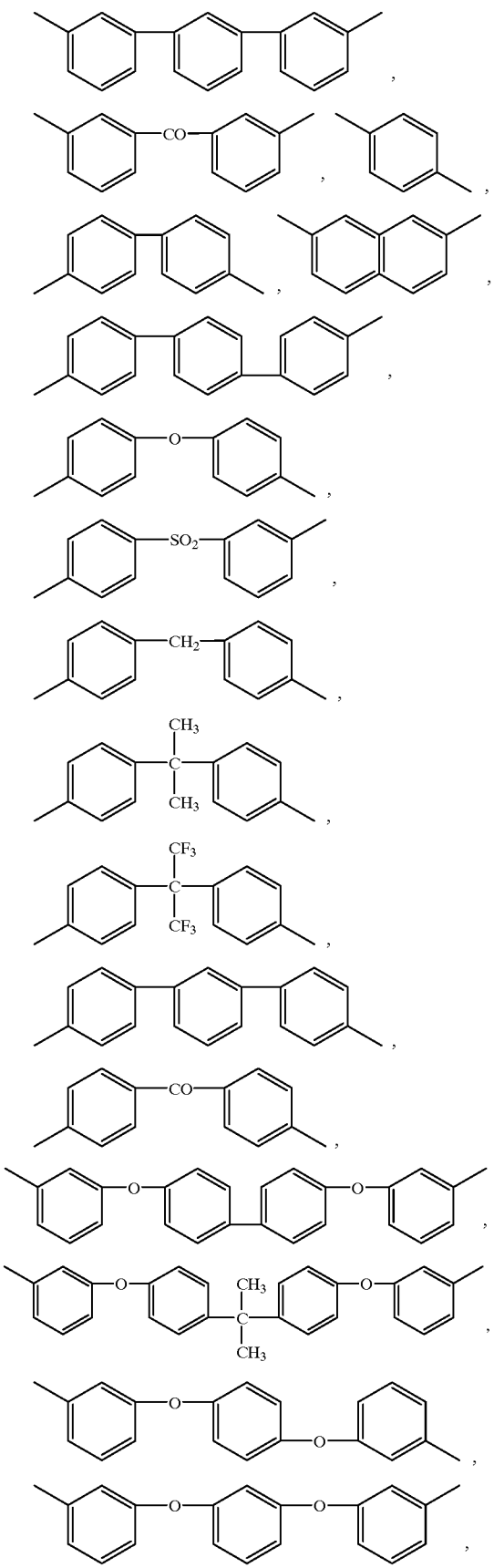
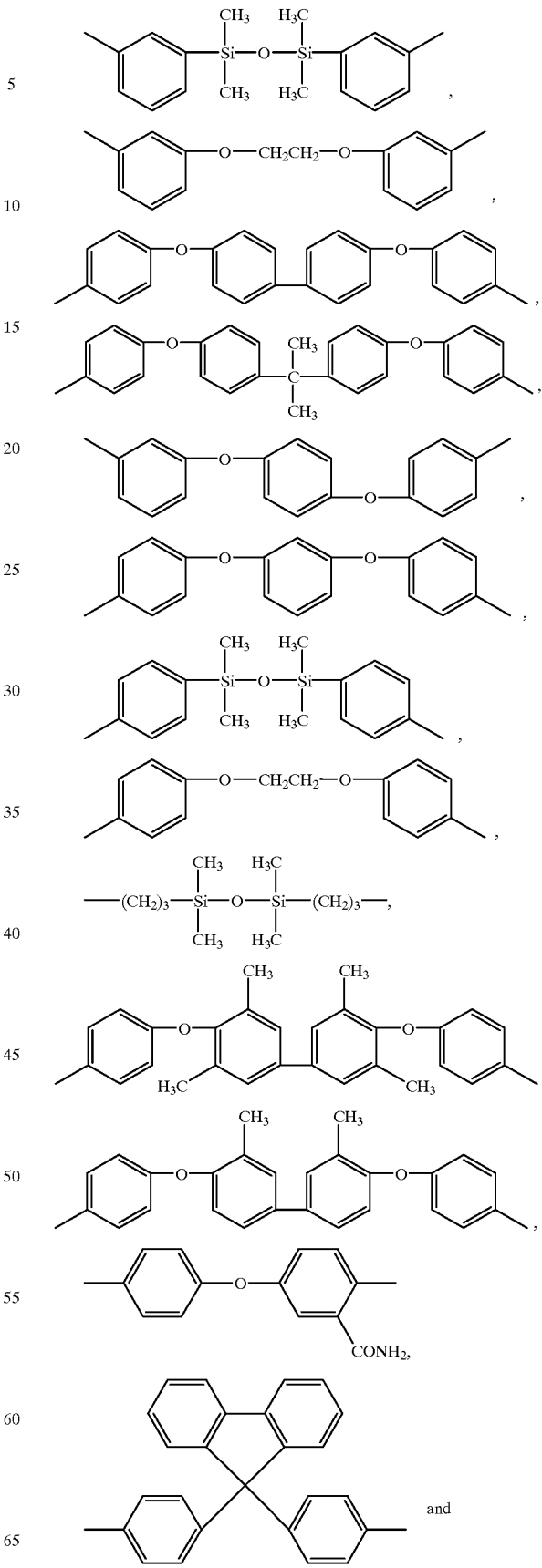

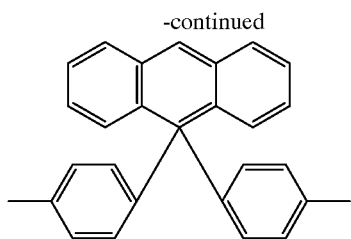

14. A polyimide precursor according to claim 6, wherein $R^3$ is represented by the formula (5) and A is at least one group selected from the group consisting of a sulfonic acid group, a sulfinic acid group, a carboxylic acid group, and a hydroxyl group.

15. A polyimide precursor according to claim 6, wherein $R^3$ is represented by the formula (5) and $R^1$ is one member selected from the following formulae:

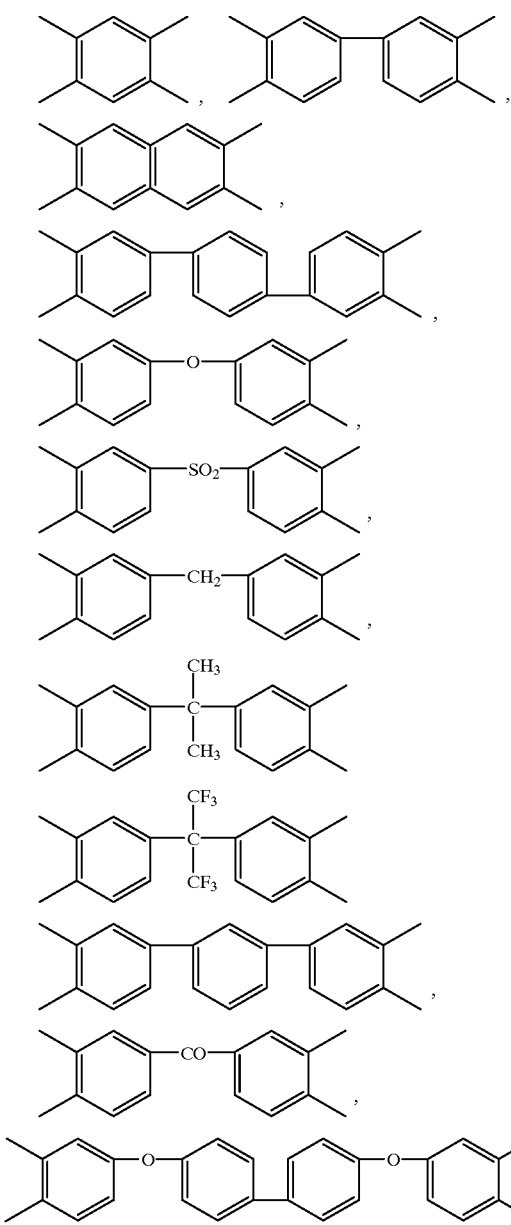

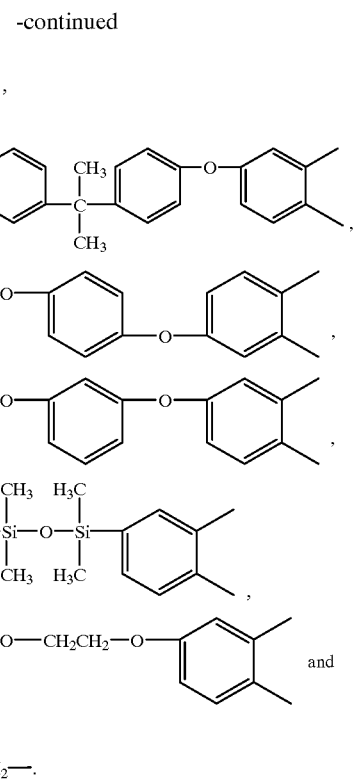

16. A polyimide precursor according to claim 6, wherein $R^3$ is represented by the formula (5) and $R^2$ is one member selected from the following formulae:

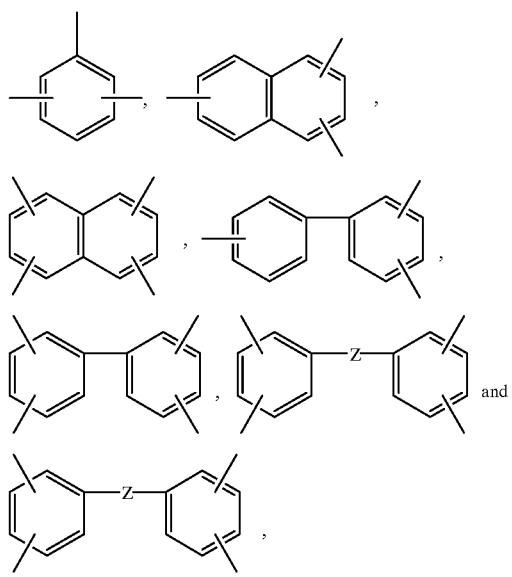

and Z is one member selected from the following formulae:

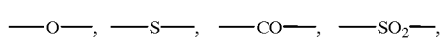

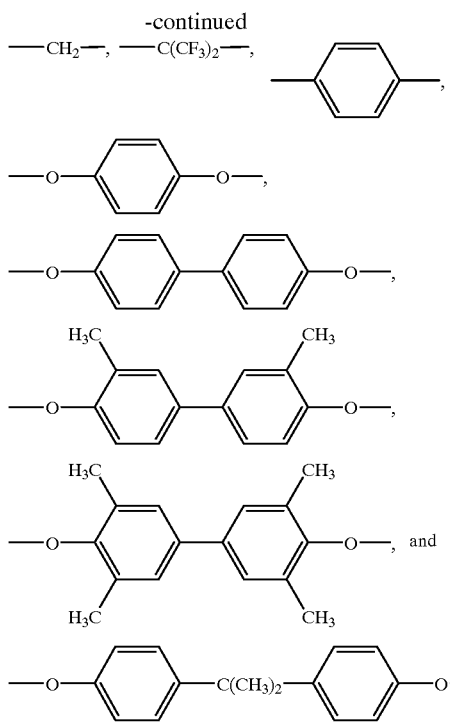

17. A polyimide precursor according to claim 6, wherein $R^3$ in one molecule is represented by the formula:

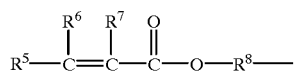

wherein $R^5$, $R^6$ and $R^7$ are independently a hydrogen atom, an alkyl group, a phenyl group, a vinyl group, or a propenyl group; and $R^8$ is a divalent organic group, in an amount of 10 to 100% by mole, and the remainder is an alkyl group having 1 to 6 carbon atoms; and A is at least one group selected from the group consisting of a sulfonic acid group, a sulfinic acid group, a carboxylic acid group, and a hydroxyl group.

18. A polyimide precursor according to claim 6, wherein $R^3$ in one molecule is represented by the formula:

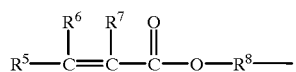

wherein $R^5$, $R^6$ and $R^7$ are independently a hydrogen atom, an alkyl group, a phenyl group, a vinyl group, or a propenyl group; and $R^8$ is a divalent organic group, in an amount of 10 to 100% by mole, and the remainder is an alkyl group having 1 to 6 carbon atoms; and $R^1$ is one member selected from the following formulae:

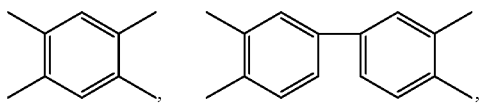

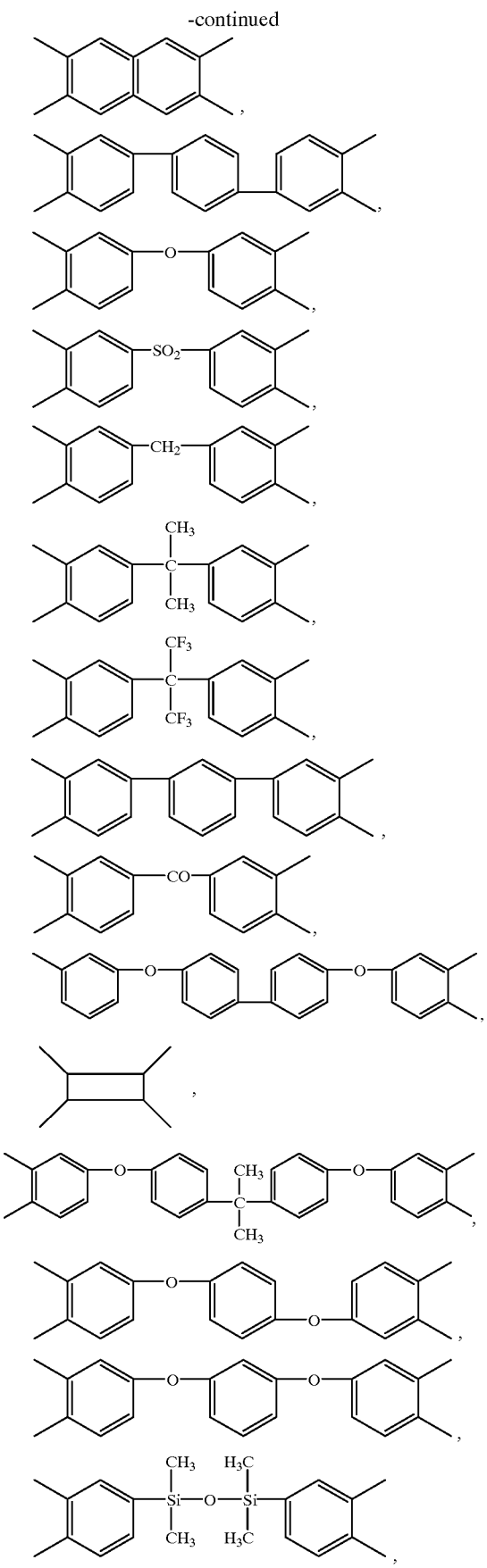

-continued

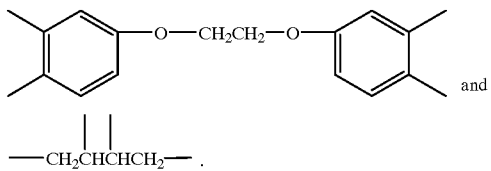
and

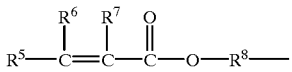

19. A polyimide precursor according to claim 6, wherein $R^3$ in one molecule is represented by the formula:

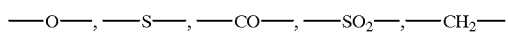

wherein $R^5$, $R^6$ and $R^7$ are independently a hydrogen atom, an alkyl group, a phenyl group, a vinyl group, or a propenyl group; and $R^8$ is a divalent organic group, in an amount of 10 to 100% by mole, and the remainder is an alkyl group having 1 to 6 carbon atoms; and $R^2$ is one member selected from the following formulae:

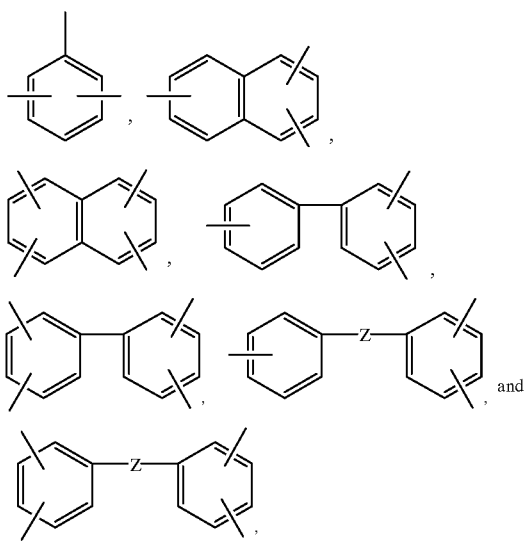

and Z is one member selected from the following formulae:

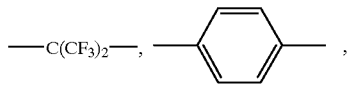

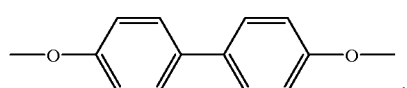

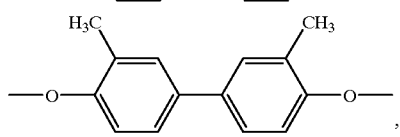

-continued

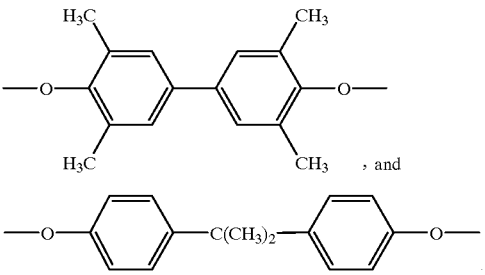

20. A polyimide precursor having repeating units of the following formula (1) and a weight-average molecular weight of 10,000 to 200,000:

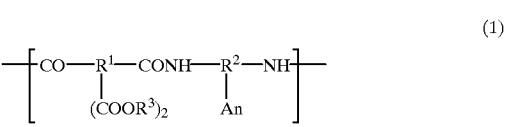
(1)

wherein $R^1$ is a tetravalent organic group having 4 or more carbon atoms; $R^2$ is a trivalent or tetravalent organic group containing one or more aromatic rings; $R^3$ is a monovalent organic group represented by the formula:

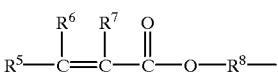
(5)

wherein $R^5$, $R^6$ and $R^7$ are independently a hydrogen atom, an alkyl group, a phenyl group, a vinyl group, or a propenyl group; and $R^8$ is a divalent organic group; A is a monovalent group showing acidity; and n is an integer of 1 or 2.

21. A polyimide precursor according to claim 20, wherein $R^3$ is represented by the formula:

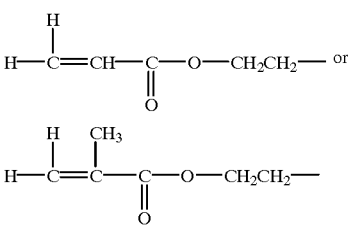

22. A polyimide precursor according to claim 20, wherein A is at least one group selected from the group consisting of a sulfonic acid group, a sulfinic acid, a carboxylic acid group, and a hydroxyl group.

23. A polyimide precursor according to claim 20, wherein R1 is one member selected from the following formulae:

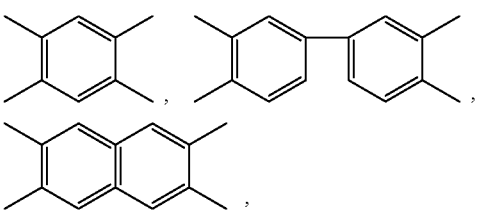

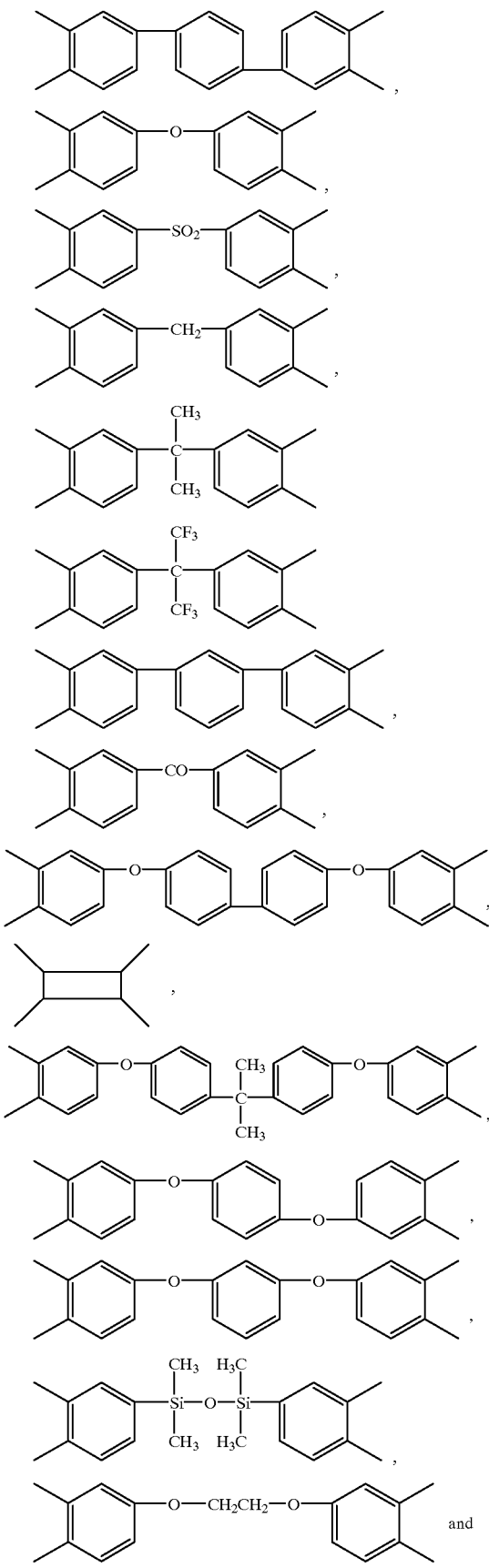
-continued
24. A polyimide precursor according to claim 20, wherein $R^2$ is one member selected from the following formulae:
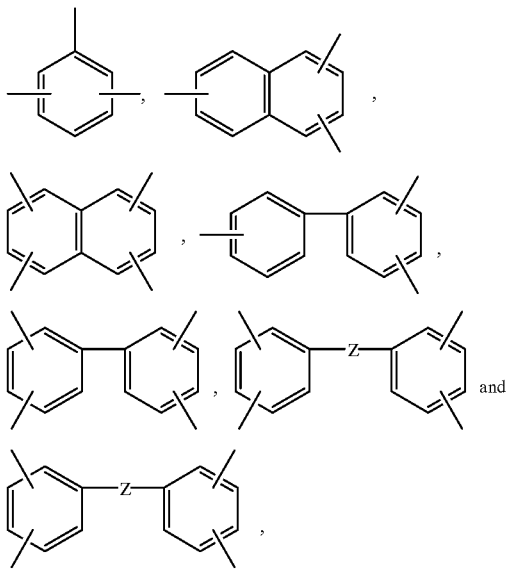
and Z is one member selected from the following formulae:
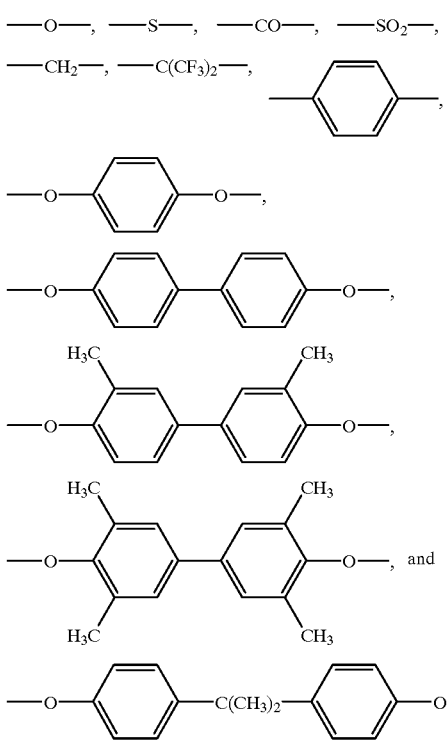
25. A polyimide precursor having repeating units of the following formula (1) and a weight-average molecular weight of 10,000 to 200,000:

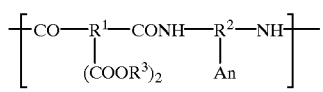  (1)

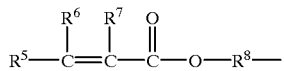  (5)

wherein $R^1$ is a tetravalent organic group having 4 or more carbon atoms; $R^2$ is a trivalent or tetravalent organic group containing one or more aromatic rings; $R^3$ in one molecule is represented by the formula:

wherein $R^5$, $R^6$ and $R^7$ are independently a hydrogen atom, an alkyl group, a phenyl group, a vinyl group, or a propenyl group; and $R^8$ is a divalent organic group, in an amount of 10 to 100% by mole, and the remainder is an alkyl group having 1 to 6 carbon atoms; A is a monovalent group showing acidity; and n is an integer of 1 or 2.

26. A polyimide precursor according to claim 25, wherein A is at least one group selected from the group consisting of a slufonic acid group, a sulfinic acid group, a carboxylic acid group, and a hydroxyl group.

27. A polyimide precursor according to claim 25, wherein $R^1$ is one member selected from the following formulae:

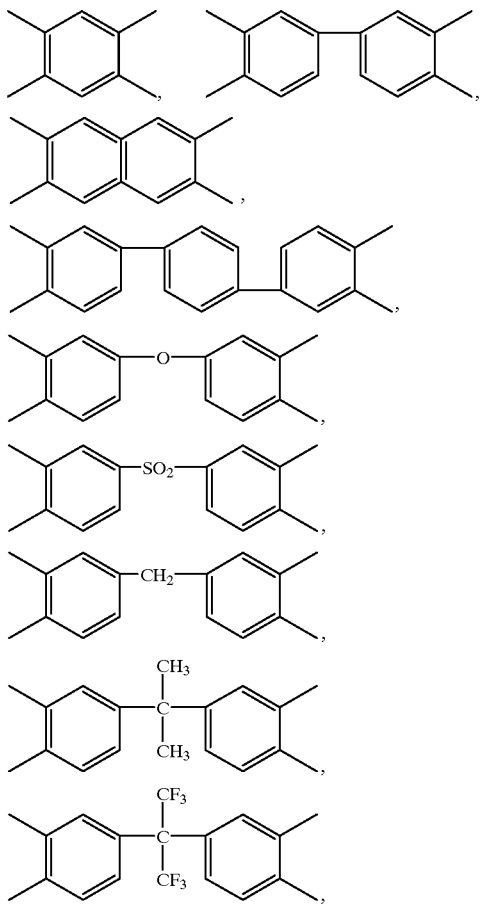

-continued

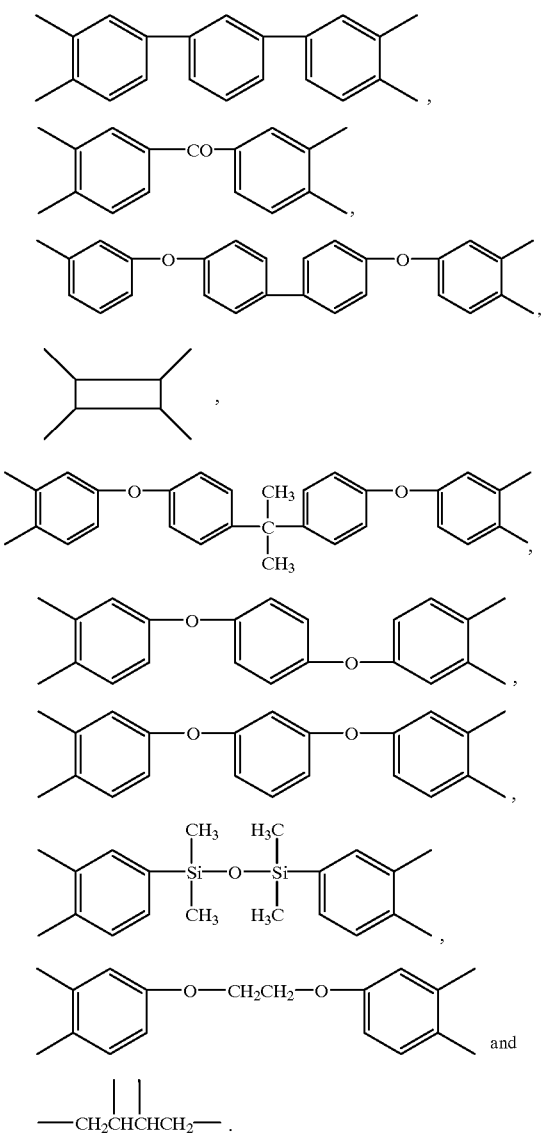

28. A polyimide precursor according to claim 25, wherein $R^2$ is one member selected from the following formulae:

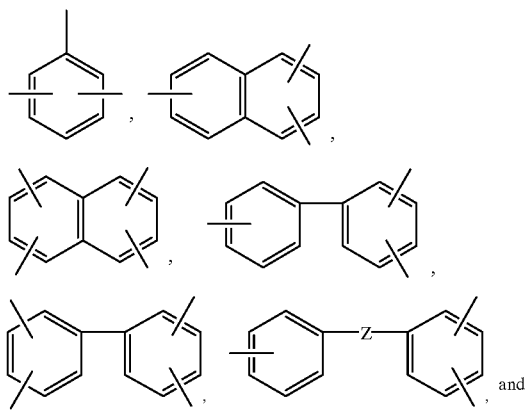

-continued

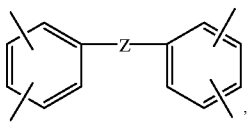

and Z is one member selected from the following formulae:

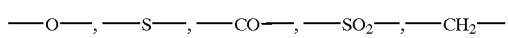

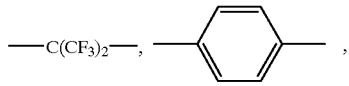

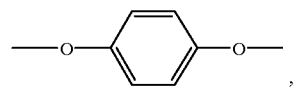

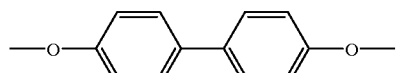

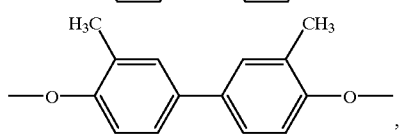

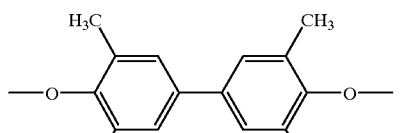

, and

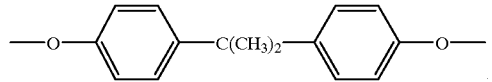

29. A polyimide precursor composition comprising a polyimide precursor having repeating units of the formula:

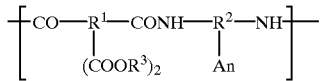
(1)

wherein $R^1$ is a tetravalent organic group having 4 or more carbon atoms; $R^2$ is a trivalent or tetravalent organic group containing one or more aromatic rings; $R^3$ is (a) a group represented by the formula:

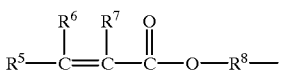
(5)

wherein $R^5$, $R^6$ and $R^7$ are independently a hydrogen atom, an alkyl group, a phenyl group, a vinyl group, or a propenyl group; and $R^8$ is a divalent organic group, or a combination of (a) and (b) an alkyl group having 1 to 6 carbon atoms; A is a monovalent group showing acidity; and n is an integer of 1 or 2.

30. A polyimide precursor composition according to claim 29, wherein the polyimide precursor is contained in an amount of 100 parts by weight, together with 0.1 to 50 parts by weight of a photosensitizer, and 0.1 to 50 parts by weight of a photopolymerization auxiliarly agent.

31. A polyimide precursor composition according to claim 29, wherein the polyimide precursor further has repeating units of the formula:

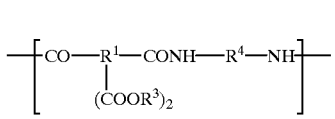
(2)

wherein $R^1$ is a tetravalent organic group having 4 or more carbon atoms; $R^3$ is a monovalent organic group; and $R^4$ is a divalent organic group containing one or more aromatic rings or silicon atoms, the number of repeating units of the formula (1) being 10 or more, and the number of repeating units of the formula (2) being 90 or less, when a total of repeating units of the formulae (1) and (2) is 100.

32. A polyimide precursor composition according to claim 31, wherein the polyimide precursor is contained in an amount of 100 parts by weight, together with 0.1 to 50 parts by weight of photosensitizer, and 0.1 to 50 parts by weight of a photopolymerization auxiliarly agent.

33. A polyimide precursor composition according to claim 29, wherein A is at least one group selected from the group consisting of a sulfonic acid group, a sulfinic acid group, a carboxylic acid group and a hydroxyl group.

34. A polyimide precursor composition according to claim 33, wherein A is a carboxylic acid group.

35. A polyimide precursor composition comprising a polyimide precursor, having repeating units of the formula:

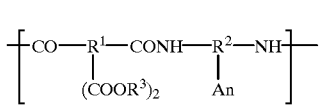
(1)

wherein $R^1$ is a tetravalent organic group having 4 or more carbon atoms; $R^2$ is a trivalent or tetravalent organic group containing one or more aromatic rings; $R^3$ is a monovalent organic group; A is a monovalent group showing acidity; and n is an integer of 1 or 2, and a siloxane-containing polyamide acid, having repeating units represented by the formulae (24):

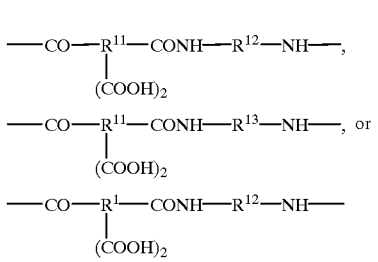
(24)

wherein $R^1$ is a divalent organic group having 4 or more carbon atoms; $R^{11}$ is a divalent organic group having one or more siloxane skeletons; $R^{12}$ is a divalent organic group having one or more siloxane skeletons; and $R^{13}$ is a divalent organic group having one or more aromatic groups, wherein the polyimide precursor is contained in an amount of 70 to 99 parts by weight, and the polyamide acid is contained in an amount of 1 to 30 parts by weight.

36. A polyimide precursor composition according to claim 35, wherein the siloxane-containing polyamide acid further has repeating units of the formula:

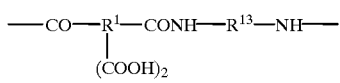
(25)

wherein $R^1$ is a tetravalent organic group having 4 or more carbon atoms; and $R^{13}$ is a divalent organic group containing two or more aromatic rings, the number of repeating units of the formula (24) being 1 or more, and the number of repeating units of the formula (25) being 99 or less, when a total of the repeating units of the formulae (24) and (25) is 100.

37. A polyimide precursor composition according to claim 35, wherein $R^{11}$ is one member selected from the following formulae:

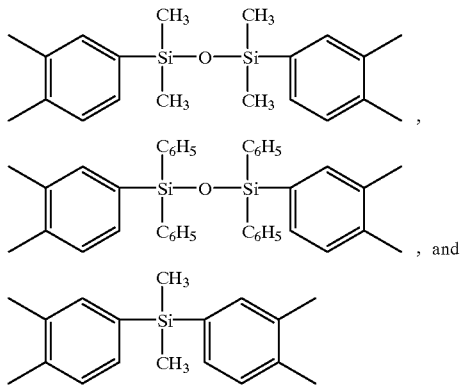

and $R^{12}$ is one member selected from the following formulae:

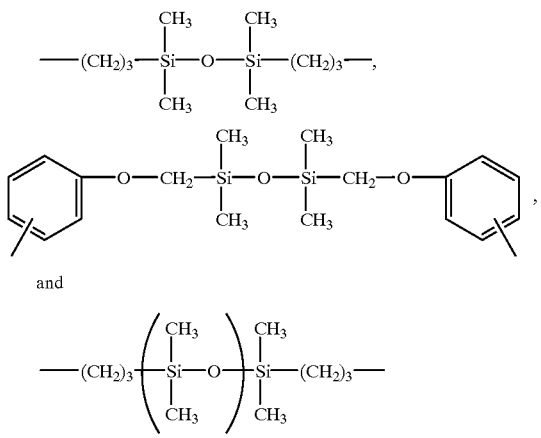

wherein n is an integer of 2 to 12.

38. A polyimide precursor composition comprising a polyimide precursor having repeating units of the formula:

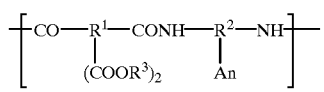
(1)

wherein $R^1$ is a tetravalent organic group having 4 or more carbon atoms; $R^2$ is a trivalent or tetravalent organic group containing one or more aromatic rings; $R^3$ is (a) a group represented by the formula:

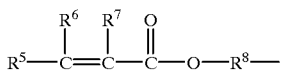
(5)

wherein $R^5$, $R^6$ and $R^7$ are independently a hydrogen atom, an alkyl group, a phenyl group, a vinyl group, or a propenyl group; and $R^8$ is a divalent organic group, or a combination of (a) and (b) an alkyl group having 1 to 6 carbon atoms; A is a monovalent group showing acidity; and n is an integer of 1 or 2, and further having repeating units of the formula:

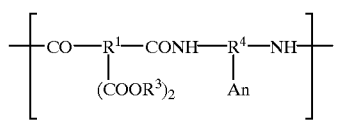
(2)

wherein $R^1$ is as above; $R^3$ is a monovalent organic group; and $R^4$ is a divalent organic group containing one or more aromatic rings or silicon atoms, the number of repeating units of the formula (1) being 10 or more, and the number of repeating units of the formula (2) being 90 or less, when a total of repeating units of the formulae (1) and (2) is 100, wherein the polyimide precursor is contained in an amount of 70 to 99 parts by weight, and a siloxane-containing polyamide acid having repeating units represented by the formula (24):

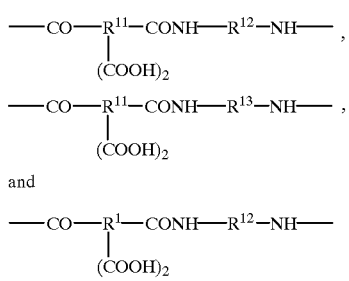
(24)

wherein $R^1$ is as above; $R^{11}$ is a divalent organic group having one or more siloxane skeletons; $R^{12}$ is a divalent organic group having one or more siloxane skeletons; and $R^{13}$ is a divalent organic group having one or more aromatic rings, is also contained in an amount of 1 to 30 parts by weight.

39. A polyimide precursor composition according to claim 38, wherein the siloxane-containing polyamide acid further has repeating units of the formula:

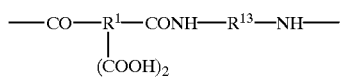 (25)
wherein $R^1$ is a tetravalent organic group having 4 or more carbon atoms; and $R^{13}$ is a divalent organic group containing two or more aromatic rings, the number of repeating units of the formula (24) being 1 or more, and the number of repeating units of the formula (25) being 99 or less, when a total of the repeating units of the formulae (24) and (25) is 100.
* * * * *